United States Patent [19]
Wada et al.

[11] Patent Number: 5,166,763
[45] Date of Patent: Nov. 24, 1992

[54] STATIC TYPE SEMICONDUCTOR MEMORY DEVICE AND METHOD OF MANUFACTURING THEREOF

[75] Inventors: Tomohisa Wada; Masahide Inuishi, both of Hyogo, Japan

[73] Assignee: Mitsubishi Denki Kabushiki Kaisha, Tokyo, Japan

[21] Appl. No.: 693,023

[22] Filed: Apr. 30, 1991

Related U.S. Application Data

[63] Continuation of Ser. No. 381,084, Jul. 18, 1989, abandoned.

[30] Foreign Application Priority Data

Jul. 20, 1988 [JP] Japan .................................. 63-181109

[51] Int. Cl.⁵ ..................... H01L 29/06; H01L 29/78; H01L 27/02; H01L 29/04
[52] U.S. Cl. ................................ 257/382; 257/903; 257/387; 257/395
[58] Field of Search ........................ 357/23.9, 23.1, 41, 357/55, 59

[56] References Cited

U.S. PATENT DOCUMENTS

| | | | |
|---|---|---|---|
| 4,541,006 | 9/1985 | Ariizumi et al. | 357/41 |
| 4,569,122 | 2/1986 | Chan | 29/577 |
| 4,792,841 | 12/1988 | Nagasawa et al. | 357/59 |
| 4,845,046 | 7/1989 | Shimbo | 437/41 |

FOREIGN PATENT DOCUMENTS

| | | | |
|---|---|---|---|
| 53-39088 | 4/1978 | Japan | 357/23.9 |
| 56-83974 | 7/1981 | Japan | 357/23.4 |
| 56-147466 | 11/1981 | Japan | 357/23.9 |
| 57-149774 | 9/1982 | Japan | 357/23.9 |
| 60-226120 | 11/1985 | Japan | 357/23.9 |

OTHER PUBLICATIONS

C. S. Oh et al, "A New MOSFET Structure with Self-Aligned Polysilicon Source and Drain Electrodes" IEEE Electron Device Letters, vol. EDL-5, No. 10, October 1984, pp. 400–402.

M. K. Moravvei-Farshi et al, "Effects of Interfacial Oxide Layer on Short-Channel Polycrystalline Source and Drain MOSFET's" IEEE Electron Device Letters, vol. EDL-8, No. 4, April 1987, pp. 165–167.

Tiao-Yuan Huang et al, "A MOS Transistor with Self-Aligned Polysilicon Source Drain" IEEE Electron Device Letters, vol. EDL-7, No. 5, May 1986, pp. 314–316.

*Primary Examiner*—Jerome Jackson, Jr.
*Assistant Examiner*—D. Monin
*Attorney, Agent, or Firm*—Lowe, Price, LeBlanc & Becker

[57] ABSTRACT

A static type semiconductor memory device includes memory cells each including a pair of field effect transistors (FETs) each having a gate electrode cross-coupled to a drain region connected to a power source terminal by way of a load register. The memory device includes a semiconductor substrate of a first conductivity type, polycrystal silicon layers containing impurities of a second conductivity type and first and second FETs. The polycrystal silicon layers are formed with a spacing from one another for defining a channel region on the substrate. The first and second FETs are formed on the substrate and each includes source and drain regions of a second conductivity type and a gate electrode. The source and drain regions are formed below the polycrystal silicon layers by introducing impurities from the polycrystal silicon layers into the substrate. The gate electrode is formed on the channel region and the polycrystal silicon layers with a gate insulating film interposed. The drain region of the first FET and the gate electrode of the second FET are cross-coupled to each other through the polycrystal silicon layer, while the drain region of the second FET and the gate electrode of the first FET are also similarly cross-coupled to each other. The parasitic resistance of the source and drain regions can be reduced, while the leakage current due to the short channel effect can also be reduced. Since the memory cell is freed of asymmetries, a static type semiconductor memory device is provided with is improved both in stability and data storage property.

11 Claims, 18 Drawing Sheets

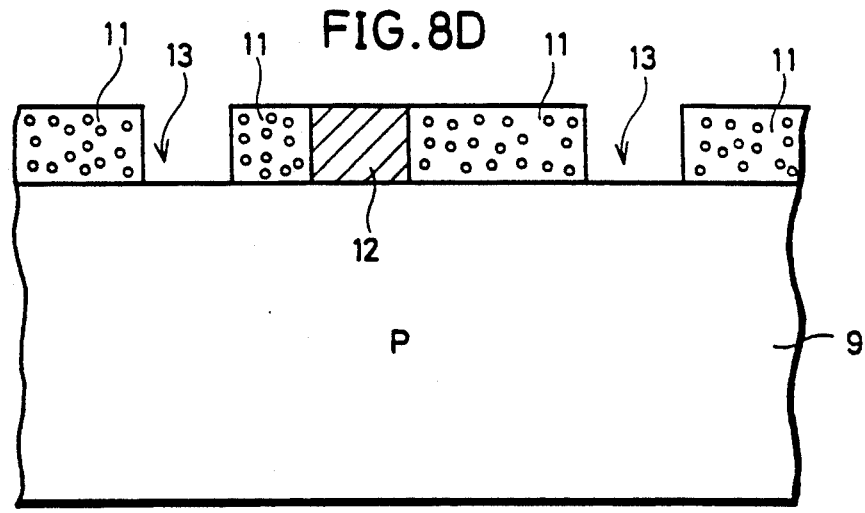
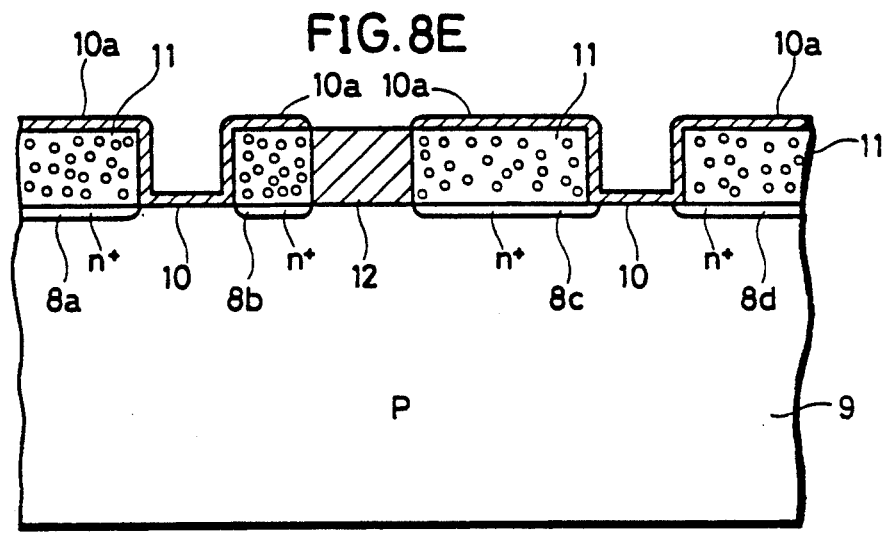
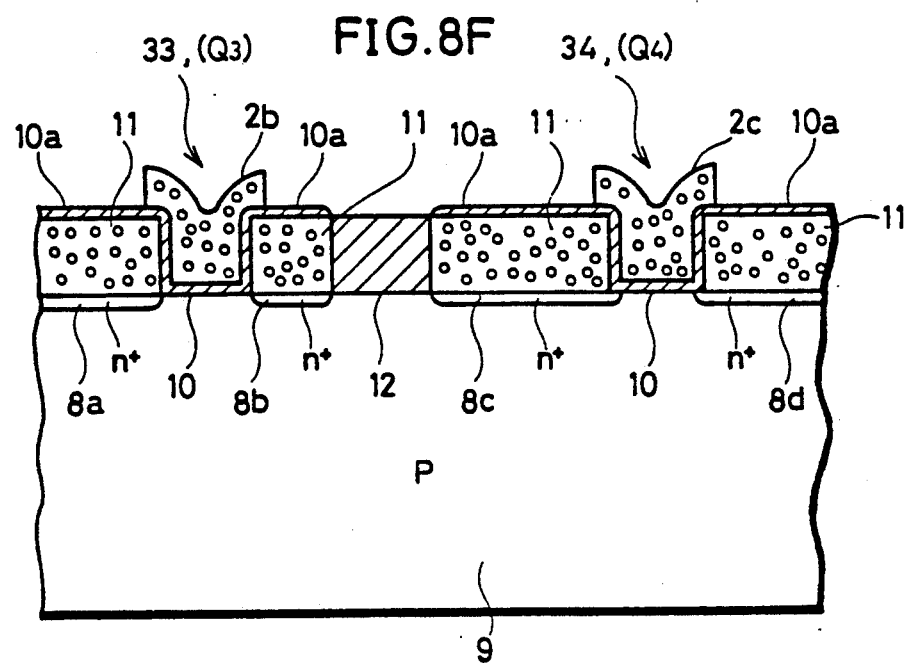

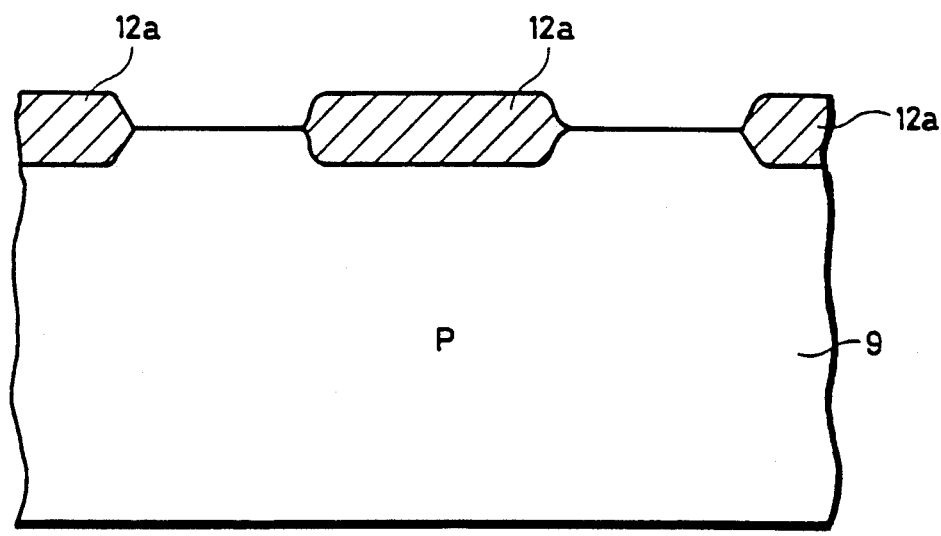
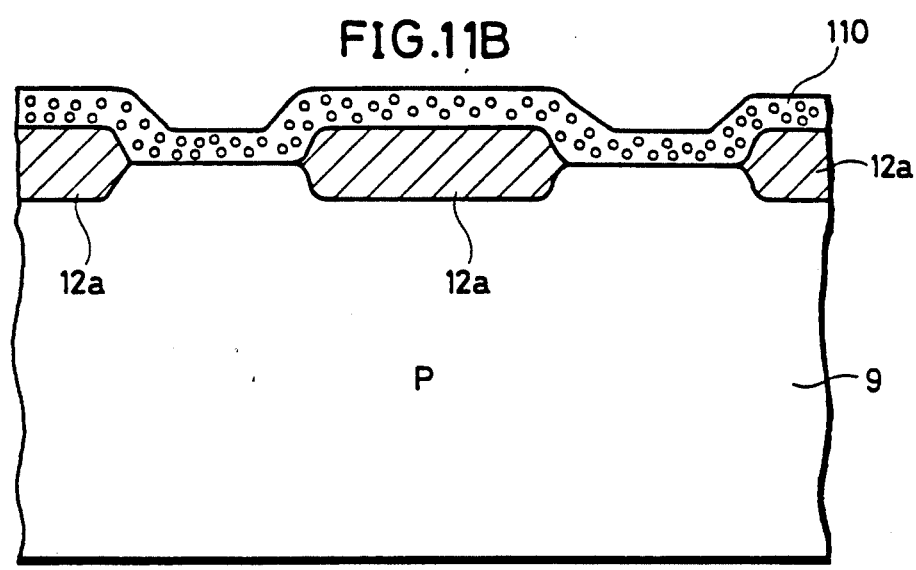
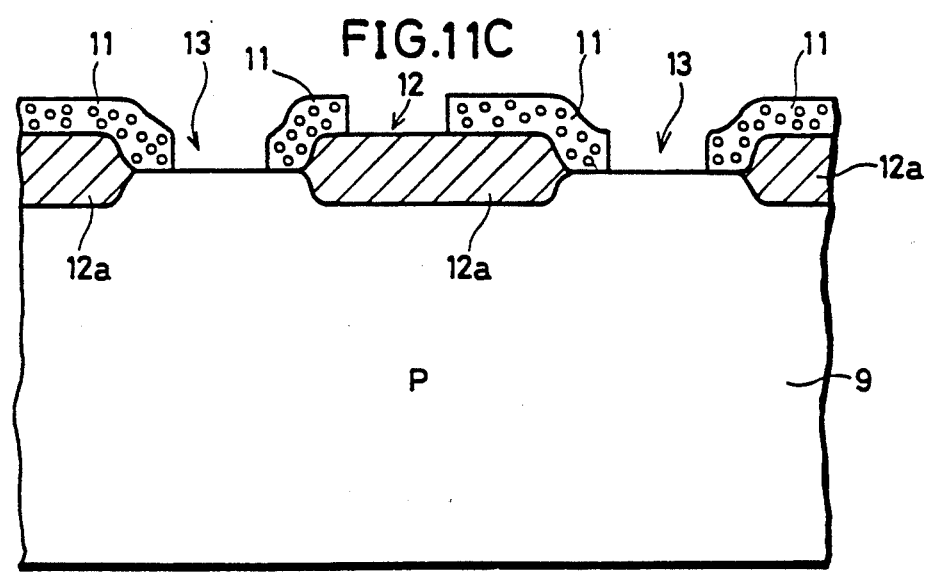

STATIC TYPE SEMICONDUCTOR MEMORY DEVICE AND METHOD OF MANUFACTURING THEREOF

This application is a continuation of application Ser. No. 07/381,084 filed Jul. 18, 1989, now abandoned.

BACKGROUND OF THE INVENTION

1. Field of the Invention

This invention relates to a static type semiconductor memory device and a method of manufacturing the same, and, more particularly, a static type semiconductor memory device having a number of memory cells each including a pair of field effect transistors each having a gate electrode cross-coupled with a drain region connected to a power source terminal by way of a load resistor, and the method of manufacturing the same. Above all, it relates to an improvement in the structure of the memory cell.

2. Description of the Prior Art

As the static type semiconductor memory device, a so-called static random access memory, referred to hereinafter as SRAM, is well known. FIG. 1A is a block diagram showing the overall structure of such conventional SRAM. FIG. 1B is an equivalent circuit diagram showing a memory cell of the SRAM shown in FIG. 1A. FIG. 1C is a block diagram showing the flow of data in the SRAM shown in FIG. 1A. Meanwhile, FIG. 1A shows an example of an 8 kiloword ×8 bit SRAM.

Referring to FIG. 1A, the SRAM shown therein includes a memory cell array 101 including a plurality of memory cells 50 acting as storage locations, an X decoder 102 and a Y decoder 103 connected to associated address buffers for selecting the addresses of the memory cells, and an input/output interface section including sense amplifiers connected to the output buffer. Each of the memory cells 50 as the storage portions is connected at an intersection of a bit line pair connected to the Y decoder 103 and a word line connected to the X decoder 102 in a matrix configuration for constituting the memory cell array 101. Responsive to the column address signals and the row address signals applied from outside, one of the memory cells 50 at the intersection of each bit line pair and each word line selected by the X decoder 102 and the Y decoder 103 is selected.

More specifically, responsive to an input address signal, a normal signal (X) and a reverse signal ($\overline{X}$) are produced in the address buffers. Responsive to the X and $\overline{X}$ signals, the X decoder 102 selects one of the 256 columns, charges the word line of that column to High and discharges all other word lines to Low. The memory cell 50 of the selected column is thereby activated to output the data therein to each bit line and $\overline{\text{bit}}$ line. Only one of bit line—$\overline{\text{bit}}$ line pair of 32 bit line—$\overline{\text{bit}}$ line pairs of each channel is connected to a I/O line—I/O line pair by way of a multiplexer. The selection is performed by the Y decoder 103. In this manner, only the desired 8-bit memory cells are connected to the I/O line.

When writing data, the input data are entered into the thus selected memory cell 50. On the other hand, when reading out data, the data stored in the selected memory cell 50 are sensed and amplified by the sense amplifier so as to be outputted to outside as output data.

The data read-out and writing operation will be explained in more detail by referring to FIG. 1C. As shown in FIG. 1A, the sense amplifier and the write driver are connected to the I/0 line, and data are transmitted in the direction of the solid line arrow mark during read out and in the direction of the dotted line arrow mark during writing. There are a write enable signal or We signal and an output enable signal or I/0 signal acting, as it were, as valves for controlling the data flow, and adapted to control the write driver output to high impedance and the output buffer output to high impedance, respectively.

Referring to FIG. 1B, a flip-flop type memory cell is formed in one memory cell 50 by metal oxide semiconductor field effect transistors or MOSFETs (Q3, Q4) 33, 34 as two driver transistors each having its gate electrode cross-coupled to its draining region, and high resistance loads (R1, R2) 35, 36 connected to each drain region. Each of the two MOSFETs 33, 34 has its drain region connected to two MOSFETs (Q1, Q2) 31, 32 as two access transistors. Each of these MOSFETs 31, 32 has its gate electrode connected to the word line 43. When the word line 43 is in the selected state, the data stored in the MOSFETs 33, 34 is transferred via MOSFETs 31, 32 to a bit line 39 and a $\overline{\text{bit}}$ line 40. One of the memory cell modes 41 is connected to the drain region of the MOSFETs 43 and the gate electrode of the MOSFETs 34 via wire sections DW formed by an impurity-diffusion layer. The other memory cell node 42 is connected to the gate electrode of the MOSFETs 33 and the drain region of the MOSFETs 34 via wire sections PW formed by a polycrystal silicon layer. Each of the MOSFETs 33, 34 has its source region connected to a ground potential 38. On the other hand, each of the MOSFETs 33 and 34 has its drain region connected to a power source potential (Vcc) 37 via each of the high resistance loads 35, 36.

The MOSFETs 33, 34 are formed as a bistable flip-flop circuit by having the drain regions and the gate electrodes cross-coupled to each other so as to enable bit data to be stored. More specifically, a 1-bit data may be stored when one of the memory cell nodes 41 is at the "High" level potential and the other memory cell node 42 is at the "LOW" level potential, or vice versa. That is, when the word line 43 is at the "HIGH" level, the MOSFETs 31, 32 are in the turned-on state, so that the memory cell nodes 41, 42 are conductively connected to the bit lines 39, 40. At this time, the voltage associated with the states of the MOSFETs 33, 34 are generated on the bit lines 39, 40 by way of the MOSFETs 31, 32. In this manner, the data stored in the memory cell 50 is read out. When writing data in the memory cell 50, a voltage associated with the desired writing state is applied to each of the bit lines 39, 40, while the MOSFETs 31, 32 are in the turned-on state. Meanwhile, the flip-flop circuit constituted by the MOSFETs 33, 34 is supplied with the current from the source potential 37 by way of the high resistance loads 35, 36, for maintaining the storage state of the data latched in the flip-flop circuit.

FIG. 2 shows in plan view the pattern layout of the above described high resistance load type SRAM memory cell. FIG. 3 shows, in a simplified plan view, the pattern layout of the SRAM memory cell shown in FIG. 2.

Referring to FIGS. 2 and 3, an isolation region 1 is formed by an oxide layer of a larger film thickness on a semiconductor substrate. First polysilicon layers 2a, 2b 2c are formed on this isolation region 1. The first polysilicon layer 2a forms a word line and is used simultaneously as the gate electrodes of the MOSFETs 31 and 32 in regions other than the isolation region 1. The first polysilicon layers 2b, 2c form gate electrodes of the MOSFETs 33, 34, respectively. An N type impurity-diffusion region is formed in the regions of the P-type semiconductor substrate other than the isolation region 1 and the first polysilicon layers 2a, 2b, 2c.

Second polysilicon layers 4a, 4b, 4c are formed on the first polysilicon layers 2a, 2b, 2c with insulating layers interposed. The second polysilicon layer 4a forms a wiring from the MOSFETs 35, 36 to the source potential (Vcc) 37. The second polysilicon layer 4b is used as the cross-coupling wiring in the memory cell. This second polysilicon layer 4b interconnects the drain region of the MOSFET 34, the gate electrode 2b of the MOSFET 33 and the source region of the MOSFET 32 by way of a first buried contact hole 3b. The second polysilicon layer 4c interconnects the gate electrode 2c of the MOSFET 34 and the source region of the MOSFET 31 by way of a first buried contact hole 3c.

A third polysilicon layer 6, surrounded by a dotted chain line, is formed on the second polysilicon layers 4a, 4b, 4c with an insulating layer interposed. This third polysilicon layer 6 forms high resistance loads 35, 36. The third polysilicon layer 6 is connected to a wiring layer 4a in a power source potential (Vcc) 37 by way of a second buried contact hole 5a. This third polysilicon layer 6 is also connected to each of the memory cell nodes 41, 42 by way of second buried contact holes 5b, 5c.

The drain regions of the MOSFETs 31, 32 are connected by way of contact holes 7a, 7b to bit lines 39, 40 formed by aluminum or the like material.

FIG. 4 is a partial cross-sectional view taken along line IV—IV in FIG. 3 those portions of the MOSFETs 31, 32, 33, 34 that are formed after the formation of the gate electrode are not shown for simplifying the illustration. Referring to FIG. 4, n+diffusion regions 8a, 8b, 8c, 8d are formed on the main surface of the P-type silicon semiconductor substrate 9. Impurity-diffusion regions 8a, 8b represent the source and drain regions of the MOSFET 33. The impurity-diffusion regions 8c, 8d represent the drain and source regions of the MOSFET 34. The gate electrodes 2b, 2c are formed on the main surface of the silicon semiconductor substrate 9 with a gate oxide film 0 interposed.

In the above described conventional high resistance load type SRAM memory cell, it has been tried to miniaturize or reduce the size of its component of the device in keeping with the tendency toward higher integration of the memory device. Thus it has been tried to reduce the size not only in the horizontal direction along the main surface of the semiconductor substrate but in the perpendicular or laminating direction orthogonal to the main surface of the semiconductor substrate. This has given rise to the following various problems.

(a) Increased sheet resistance in the n+impurity-diffusion region

In keeping with miniaturization, the channel length of the MOSFETs tends to be reduced. Also, in keeping with miniaturization in the horizontal and the laminating directions, it has become necessary to reduce the thickness of the gate oxide film 10 or the n+diffusion regions 8a to 8d and to form the shallow n+ —p junction. As the n+diffusion regions becomes shallow in this manner, the sheet resistance of the diffusion region is increased. As shown in FIGS. 1B, 2 and 3, this n+diffusion region is used as the wiring connection in the memory cell or as the wiring layer of the memory cell to the ground potential. For this reason, an increased parasitic resistance in this diffusion region affects the operation of the memory cell.

Referring to FIG. 2, the drain region of the MOSFET 33 is extended in the right upper direction so as to be connected with the gate electrode 2c of the MOSFET 34 and the source region of the MOSFET 31. On the other hand, the drain region of the MOSFET 34 is connected to the gate electrode 2b of the MOSFET 33 and to the source region of the MOSFET 32 by way of the second polysilicon layer 4b. In this manner, the cross-coupling wiring in the memory cell is made on one hand through the diffusion layer and on the other hand through the polysilicon layer. This produces asymmetricities in the memory cell which should be formed symmetrically in the left and right direction. Moreover, a high-resistance load is connected in series with the drain regions of the MOSFET 33 through the diffusion region, the current driving capability of the MOSFET 33 is substantially lower than that of the MOSFET 34. As a result, there is the risk that the bistable state of the flip-flop circuit can no longer be maintained.

Also, when reading out the data stored in the memory cell, the potentials corresponding to the states of the MOSFETs 33, 34 appear on the bit lines 39, 40 through the MOSFETs 31, 32. At this time, the charges corresponding to the respective potentials are discharged through the MOSFETs 31, 33 and MOSFETs 32, 34. However, the time involved in the discharging of the charges is prolonged due to the above described connection of the high resistance load through the diffusion region, thus resulting in the increase access time in the SRAM. In this case, one of the cross-coupling wiring is made through the diffusion region, so that the asymmetricities are produced in the memory cell due to increase in the parasitic resistance thereof.

(b) Increased sub-threshold current

It is known in general that, in MOSFETs when the channel length is shortened, the sub-threshold current is increased due to short channel effects. By the sub-threshold current is meant the drain to source current when the gate voltage is below the threshold voltage and the surface of the channel region is in the weakly inverted state. This sub-threshold current is treated as the channel leakage current.

Referring to FIG. 1B, when the potential of the word line 43 is at the "Low" level, the MOSFETs 31, 32 are in the turned-off state. At this time, considering data storage to the disregard of these MOSFETs 31, 32, the MOSFET 33 is turned-off state if, for example, the memory cell node 41 is at the "High" level potential and the memory cell node 42 is at the "Low" level potential. The memory cell node 41 is charged by the high resistance load 35 so that it is maintained at the "High" level potential. This enables the data to be stored.

In this case, for decreasing the power consumption of the chip in its entirety with integration of the memory device, it is necessary to increase the resistance value of the high resistance loads 35, 36. For example, in a 1-megabit SRAM, the resistance value per each high resistance load amounts to several T ohms. On the other hand, due to miniaturization in keeping with the higher integration of the memory device, the channel length of each MOSFET is decreased. As a result, the leakage current in the turned-off state of the MOSFETs 33, 34, which could be disregarded in comparison with the charging current flowing through the high resistance loads 35, 36, can no longer be disregarded with the increase in the sub-threshold current as described hereinabove. As a result, the above data storage becomes unfeasible.

(c) Junction leakage

As discussed in (b) above, the resistance values of the high resistance loads 35, 36 are suitably modified for maintaining the power consumption of the chip with this entirety at a reasonable level in keeping with the high integration of memory device. For example, when the integration degree of the memory device is quadruplicated, the resistance value of the high resistance load is increased proportionately thereto, that is, it is at least also quadruplicated. However, it is extremely difficult to reduce the leakage current of each MOSFET inversely proportionately, that is, to reduce the leakage current to one fourth. The reason therefor resides in the so-called junction leakage in addition to the above described sub-threshold leakage.

That is, as indicated by the drain regions 8b, 8c in FIG. 4, the drain region in each MOSFET forms necessarily an n+−p junction between it and the silicon semiconductor substrate 9. The reverse leakage at this p-n junction cannot be avoided physically. The junction leakage in this case is proportional to its junction area and the junction edge length, that is, the peripheral length of the junction when seen in plan view. A junction area may be reduced with miniaturization of the component device. However, the edge length cannot be reduced so markedly as the junction area. For this reason, it ie becoming extremely difficult to reduce the junction leakage.

(d) Increased soft error ratio

With miniaturization of the memory cell area, the area of the junction or the gate electrode for forming the capacitance at the memory cell nodes 41, 42 is increased proportionally. As a result, the node capacity is decreased in reverse proportion to the increase in the integration degree of the memory device. This decrease in the node capacity means the decrease in the charges stored in the memory cell nodes. As a result, the problem is presented that the SRAM becomes vulnerable to soft errors produced by noise charges of, for example, external α-rays.

(e) Isolation

With miniaturization of the component parts of the SRAM device, it becomes necessary to miniaturize the isolation with in the isolation region 1 simultaneously. This results in the lowered breakdown voltage and increased leakage current.

SUMMARY OF THE INVENTION

It is an object of the present invention to provide a static type semiconductor memory device which is suited to high integration and low power consumption.

It is another object of the present invention to provide a static type semiconductor memory device which is improved in stability and data storage property.

It is a further object of the present invention to provide a static type semiconductor memory device in which the parasitic resistance of the wiring region in the memory cell may be reduced.

It is a further object of the present invention to provide a static type semiconductor memory device in which the leakage current caused by the short channel effect may be reduced.

It is a further object of the present invention to provide a static random access memory device which may be free from asymmetricities in the memory cell.

It is a further object of the present invention to provide a static type semiconductor memory device in which the junction leakage may be reduced.

It is a further object of the present invention to provide a static type semiconductor memory device which is improved in the resistance to soft errors.

It is a further object of the present invention to provide a method of manufacturing a static type semiconductor memory device suited to high integration and low power consumption.

It is a further object of the present invention to provide a method of manufacturing the static type semiconductor memory device which is improved in stability and data storage properties.

It is a further object of the present invention to provide a method of manufacturing a static type semiconductor memory device in which the parasitic resistance of the wiring region in the memory cell may be reduced.

It is a further object of the present invention to provide a method of manufacturing the static type semiconductor memory device in which the leakage current caused by short channel effects may be reduced.

It is a further object of the present invention to provide a method of manufacturing the static type semiconductor memory device which is may be free from asymmetricities in the memory cell.

It is a further object of the present invention to provide a method of manufacturing the static type semiconductor memory device in which the junction leakage may be reduced.

It is yet another object of the present invention to provide a method of manufacturing the static type semiconductor memory device which is improved in resistance to soft errors.

The static type semiconductor memory device according to the present invention includes a memory cell having a pair of field effect transistors each having a gate electrode cross-coupled to a drain region connected to a source terminal by way of a load resistance. The static type semiconductor memory device includes a semiconductor substrate, polycrystal silicon layers, source and drain regions and a gate electrode. The semiconductor substrate has a main surface and is of a first conductivity type. The polycrystal silicon layers containing impurities of a second conductivity type are formed on the main surface of the semiconductor substrate, insulated from one another and at a spacing from one another for defining a channel region. The source and drain regions are formed below the polycrystal silicon layers by introducing impurities from the polycrystal silicon layer into the semiconductor substrate, and are of a second conductivity type. The gate electrode is formed on the channel region and the polycrystal silicon layer with a gate insulating film.

The static type semiconductor memory device according to another aspect of the present invention includes a semiconductor substrate, polycrystal silicon layers, and first and second field effect transistors. The semiconductor substrate has a main surface and is of first conductivity type. The polycrystal silicon layers containing impurities of a second conductivity type are formed on the main surface of the semiconductor substrate, insulated from one another and at a spacing for defining the channel region on the main surface of the substrate. Each of the field effect transistors includes a channel region and is formed on the semiconductor substrate. Each of these field effect transistors includes a source region, a drain region and a gate electrode. The source and drain regions are formed below the polycrystal silicon layers by introducing impurities from the polycrystal silicon layer into the semiconductor substrate, and are of the second conductivity type. The gate electrode is formed on the channel region and the polycrystal silicon layers with a gate insulating film interposed. One of the source and the drain regions of the first field effect transistor and the gate electrode of the second field effect transistor are cross-coupled to each other by the medium of the polycrystal silicon layer, while one of the source and drain regions of the second field effect transistor and the gate electrode of the first field effect transistor are also cross-coupled to each other by the medium of the polycrystal silicon layers.

The static type semiconductor memory device according to still another aspect of the present invention includes a semiconductor substrate, polycrystal silicon layers and a memory cell. The semiconductor substrate includes a main surface and is of a first conductivity type. The memory cell is formed on the main surface of the semiconductor substrate. The polycrystal silicon layers containing impurities of a second conductivity type are formed on the main surface of the semiconductor substrate, insulated from one another and at a distance for defining a channel region on the main surface. The memory cell includes a first driver transistor, a second driver transistor, a first load element and a second load element. The first driver transistor is formed by a field effect transistor connected between the first memory cell node and the first potential node. This field effect transistor includes a gate electrode, and source and drain regions of the second conductivity type. The gate electrode is connected to the second memory cell node and formed on the channel region and the polycrystal silicon layer by the medium of a gate insulating film. The source and drain regions are formed below the polycrystal silicon layers by introducing impurities from the polycrystal silicon layer into the semiconductor substrate. The second driver transistor is formed by a field effect transistor connected between the second memory cell node and the first potential node. This field effect transistor includes a gate electrode and source and drain region of the second conductivity type. The gate electrode is connected to the first memory cell node and formed on the channel region and polycrystal silicon layers with a gate insulating film interposed. The source and drain regions are formed below the polycrystal silicon layer and by introducing impurities from the polycrystal silicon layer into the semiconductor substrate. The first load element is connected between the first memory cell node and the second potential node. The second load element is connected between the second memory cell node and the second potential node.

According to a preferred embodiment of the above described static type semiconductor memory device, the memory cell is provided at a position of intersection of the word line and the bit line pair on the main surface of the semiconductor substrate, and further includes a first access transistor and a second access transistor. The first access transistor is formed by a field effect transistor connected between the first memory cell node and one of the paired bit lines. This field effect transistor includes a gate electrode, and source and drain regions of the second conductivity type. The gate electrode is connected to the word line and is formed on the channel region and the polycrystal silicon layer with a gate insulating film interposed. The source and drain regions are formed below the polycrystal silicon layer by introducing impurities from the polycrystal silicon layer into the semiconductor substrate. The second access transistor is formed by a field effect transistor connected between the second memory cell node and the other of the paired bit lines. This field effect transistor includes a gate electrode and source and drain regions of the second conductivity type. The gate electrode is connected to the word line and is formed on the channel region and the polycrystal silicon layer with a gate insulating film interposed. The source and drain regions are formed below the polycrystal silicon layer and by introducing impurities from the polycrystal silicon layer into the semiconductor substrate.

According to a preferred embodiment of the above described static type semiconductor memory device, the memory cell is provided at a position of intersection of the word line and the bit line pair on the main surface of the semiconductor substrate, and further includes a first access transistor is formed by a field effect transistor connected between the first memory cell node and one of the paired bit lines. This field effect transistor includes a gate electrode, and source and drain regions of the second conductivity type. The gate electrode is connected to the word line and is formed on the channel region and the polycrystal silicon layer with a gate insulating film interposed. The source and drain regions are formed below the polycrystal silicon layer by introducing impurities from the polycrystal silicon layer into the semiconductor substrate. The second access transistor is formed by a field effect transistor connected between the second memory cell node and the other of the paired bit lines. This field effect transistor includes a gate electrode and source and drain regions of the second conductivity type. The gate electrode is connected to the word line and is formed on the channel region and the polycrystal silicon layer with a gate insulating film interposed. The source and drain regions are formed below the polycrystal silicon layer and by introducing impurities from the polycrystal silicon layer into the semiconductor substrate.

According to another preferred embodiment, one of the source and rain regions of each of the first and second driver transistors and the memory cell node are connected to each other by the medium of polycrystal silicon layer, while the other of the source and drain regions of each of the first and second driver transistors and the first potential node are similarly connected to each other by the medium of the polycrystal silicon layer. The polycrystal silicon layers are formed on the insulating layer formed on the main surface of the semiconductor substrate for defining the edges of the source and drain regions. The insulating layer may be of substantially the same thickness as the thickness of the gate insulating film.

In a method for producing the static type semiconductor memory device according to the present invention, the polycrystal silicon layers containing impurities of the second conductivity type are formed on the main surface of the semiconductor substrate of the first conductivity type, insulated from one another and at a spacing for defining a channel region on the main surface. The source and drain regions of the second conductivity type are formed below the polycrystal silicon layers by doping impurities contained in the polycrystal silicon layers into the semiconductor substrate. The gate electrode is formed on the channel region and the polycrystal silicon layers with a gate insulating film interposed.

According to the present invention, the source and drain regions are formed by introducing impurities from the polycrystal silicon layer into the semiconductor substrate. For this reason, the wiring connected to the source and drain regions is made of by way of these polycrystal silicon layers. Consequently, the resistance of the wiring region is determined by the resistance of the polysilicon layers, so that the resistance value of the wiring region may be lowered. As a result, the parasitic resistance in the wiring region may also be reduced.

Also, the source and drain regions are formed by impurities introduced from the polycrystal silicon layers into the semiconductor substrate, so that the shallow junction depths in the sources and drain regions may be achieved. Since the short channel effect may thereby be reduced, the sub-threshold current may also be reduced. As a result, the leakage current may be reduced so that the static type semiconductor memory device may be improved in stability and data storage property. In addition, the memory cell may be freed of asymmetricities since the cross-coupling wiring in the memory cell is made unexceptionally through the polycrystal silicon layers.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A, 8B, 8C, 8D, 8E and 8F are partial cross sectional views showing the construction shown in FIG. 7 in the sequence of the production steps.

FIGS. 11A, 11B, 11C, 11D and 11E are partial cross sectional views showing the construction shown in FIG. 10, in the sequence of the productions steps.

DESCRIPTION OF THE PREFERRED EMBODIMENTS

Referring to FIGS. 5 to 14E, illustrative embodiments of the static type semiconductor memory device according to the present invention will be explained in more detail. In the embodiment shown in these figures, the same numerals as those used for the conventional structure shown in FIGS. 1A to 4 depict the same or equivalent parts.

Figure 1A:
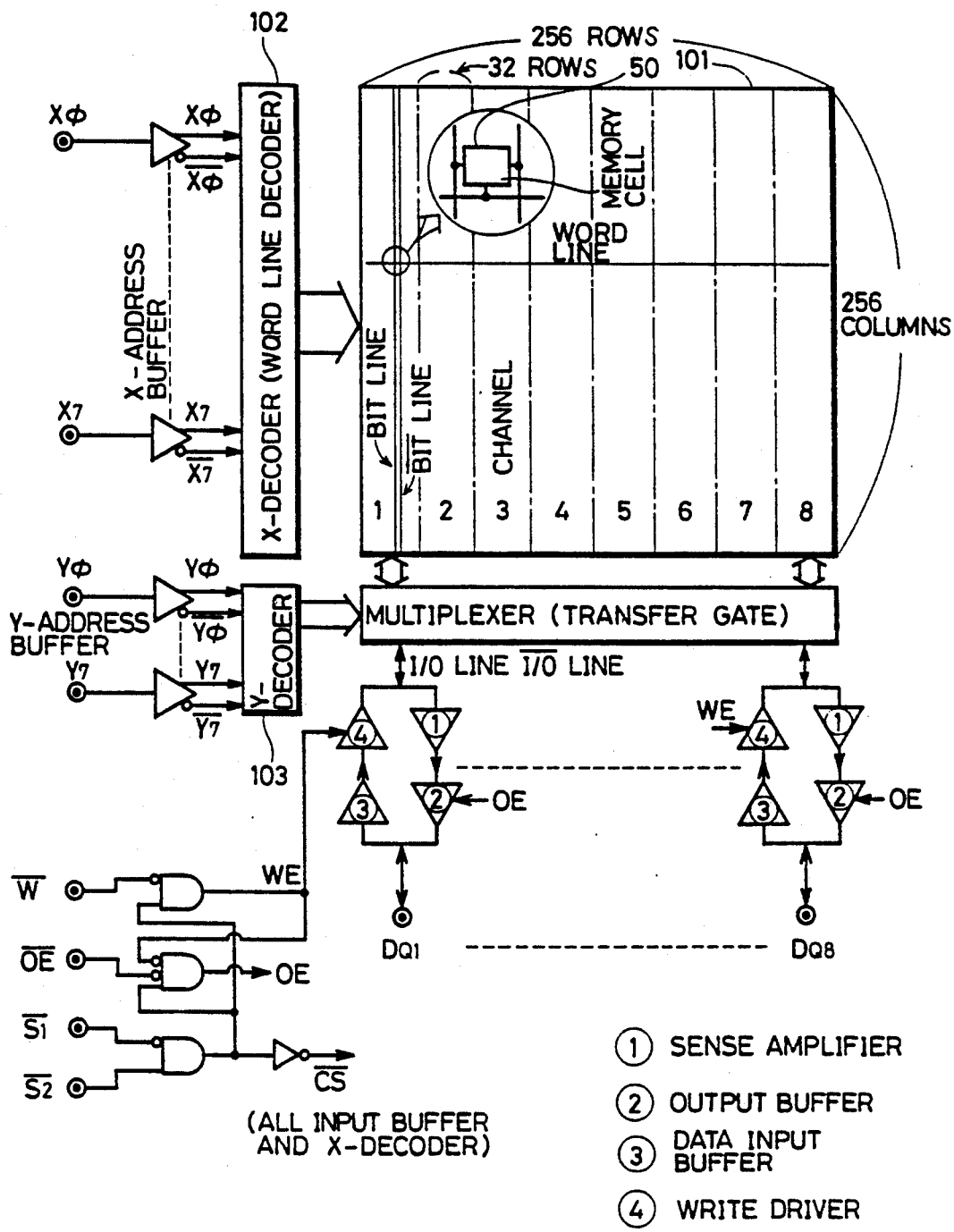
FIG. 1A is a block diagram showing the overall structure of the conventional SRAM.
Figure 1B:
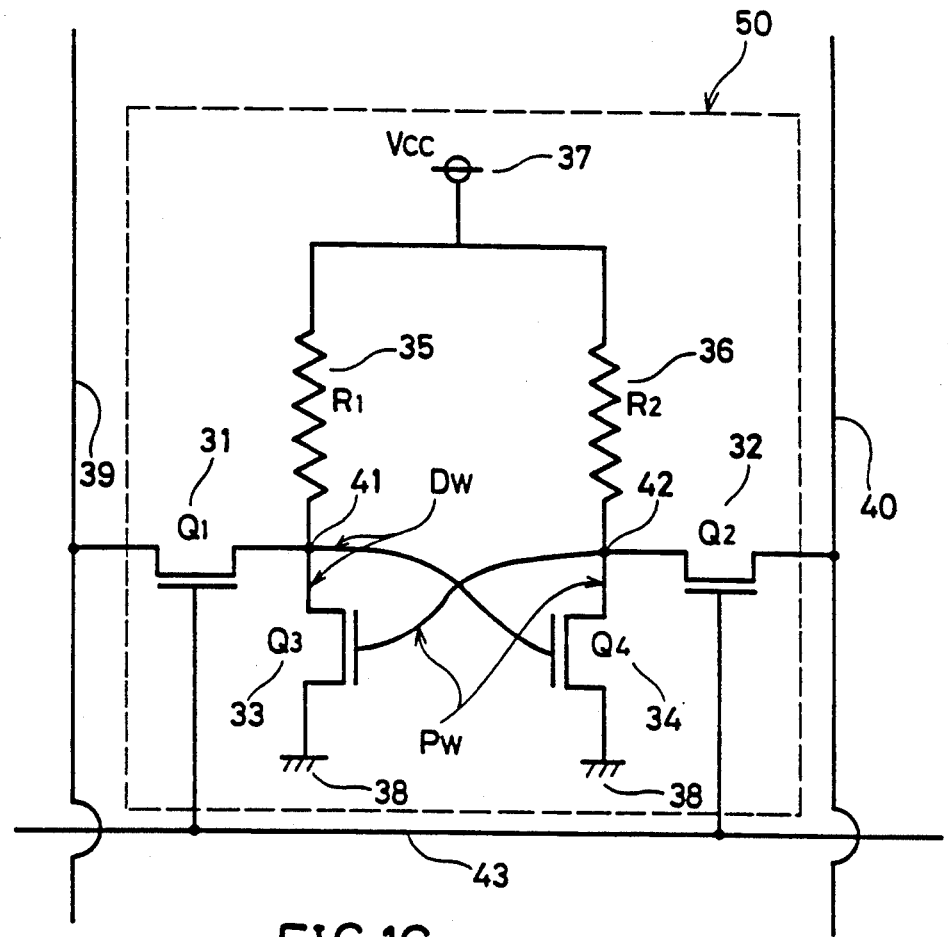
FIG. 1B is an equivalent circuit diagram corresponding to one memory cell in the conventional high resistance load type SRAM.
Figure 1C:
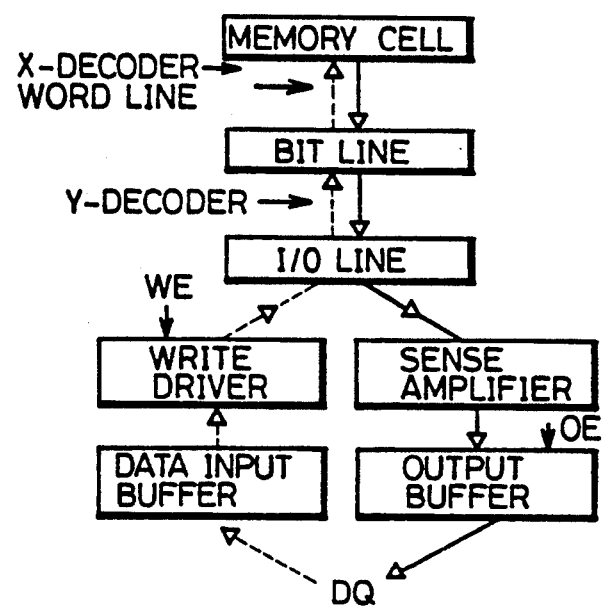
FIG. 1C shows the data flow for illustrating the operation of the SRAM shown in FIG. 1A.
Figure 2:
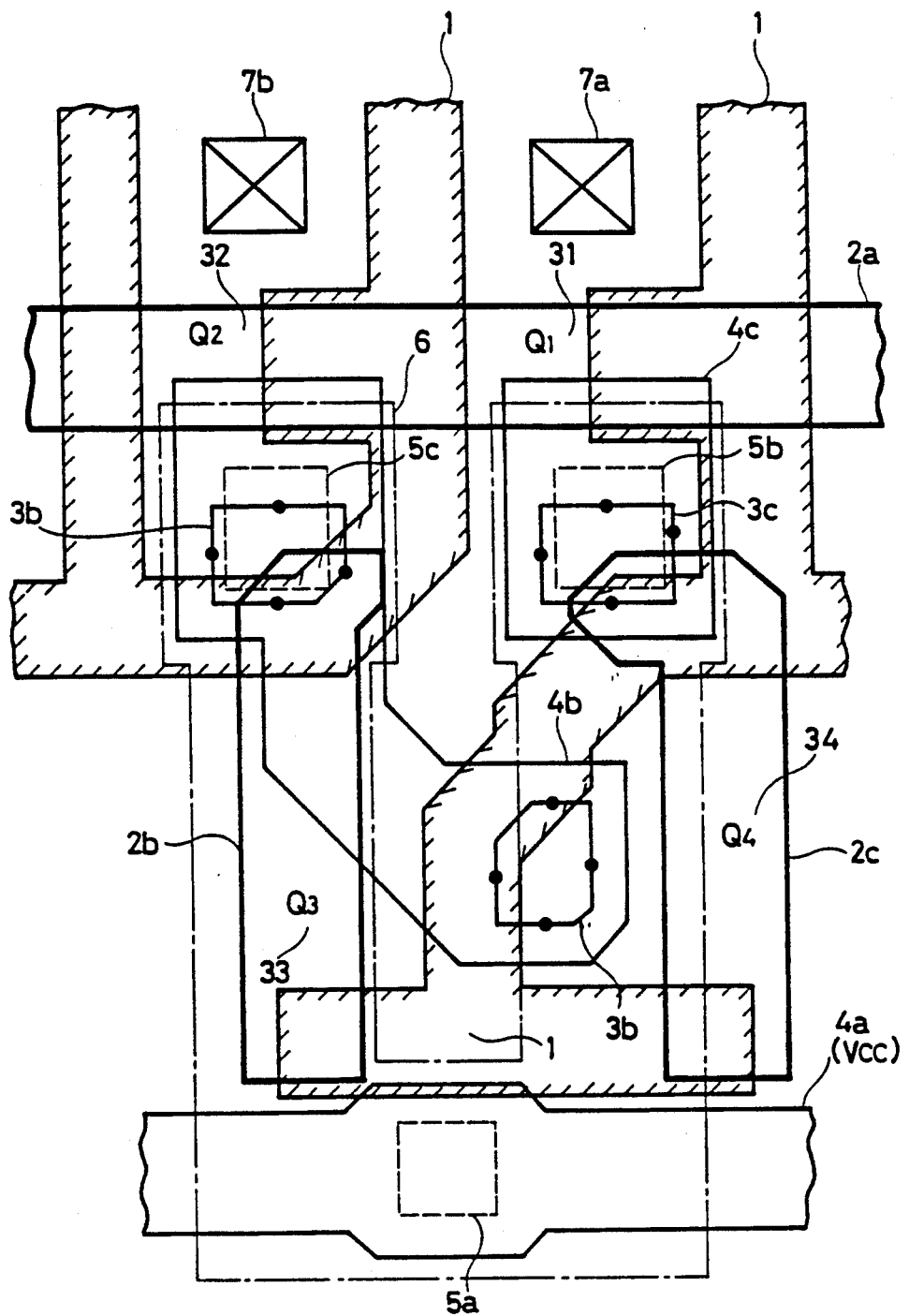
FIG. 2 is a plan view showing the pattern layout of the conventional high resistance load type SRAM memory cell.
Figure 3:
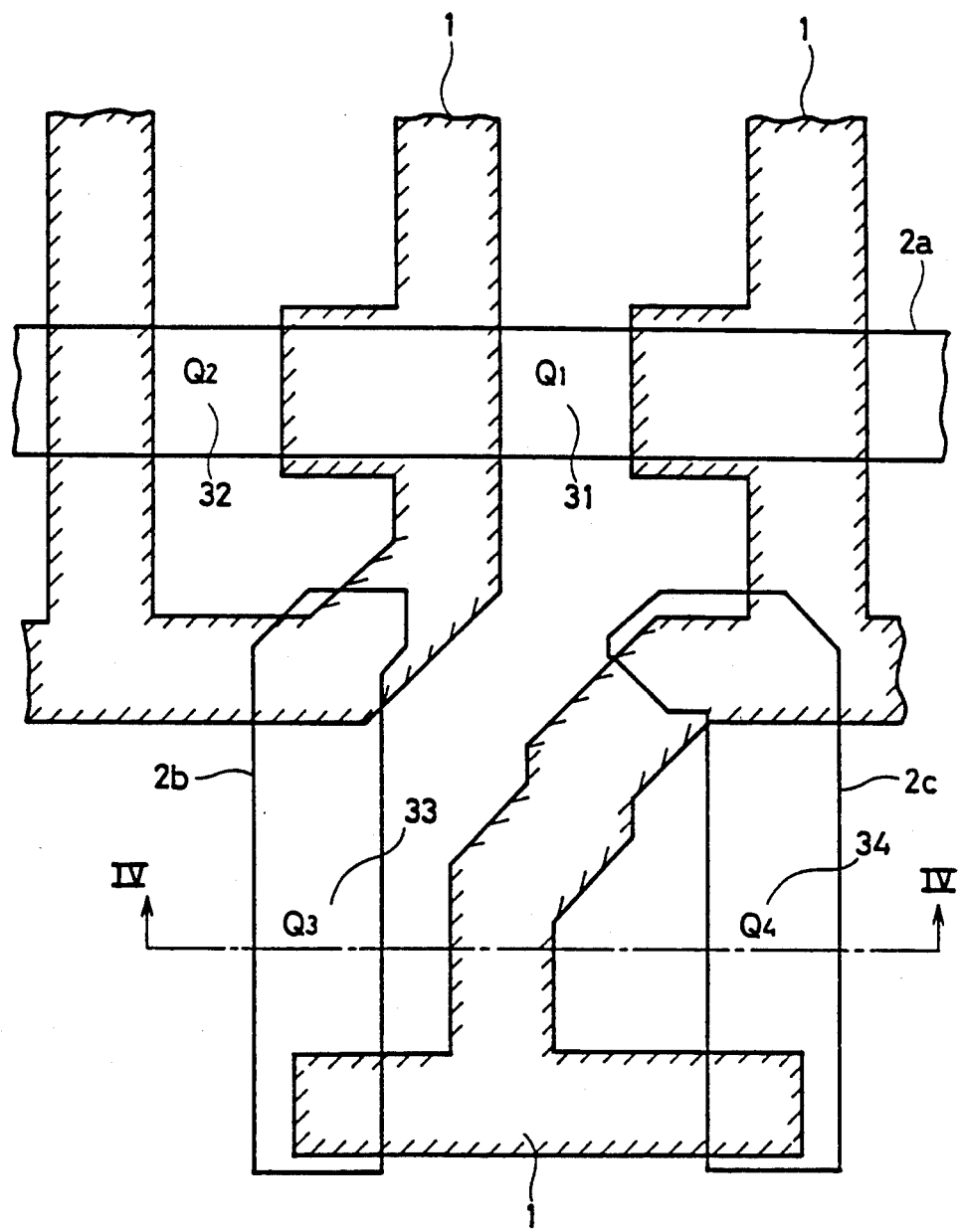
FIG. 3 is a plan view showing the pattern layout of FIG. 2 in a simplified form.
Figure 4:
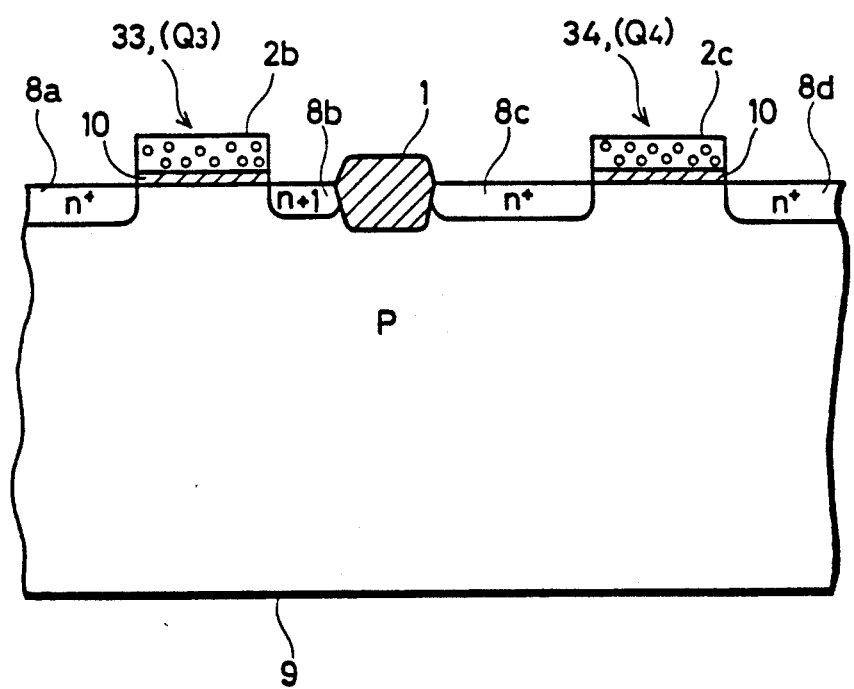
FIG. 4 is a partial sectional view taken along line IV—IV line in FIG. 3, and showing the stage of preparation up to the formation of the gate electrode.
Figure 5:
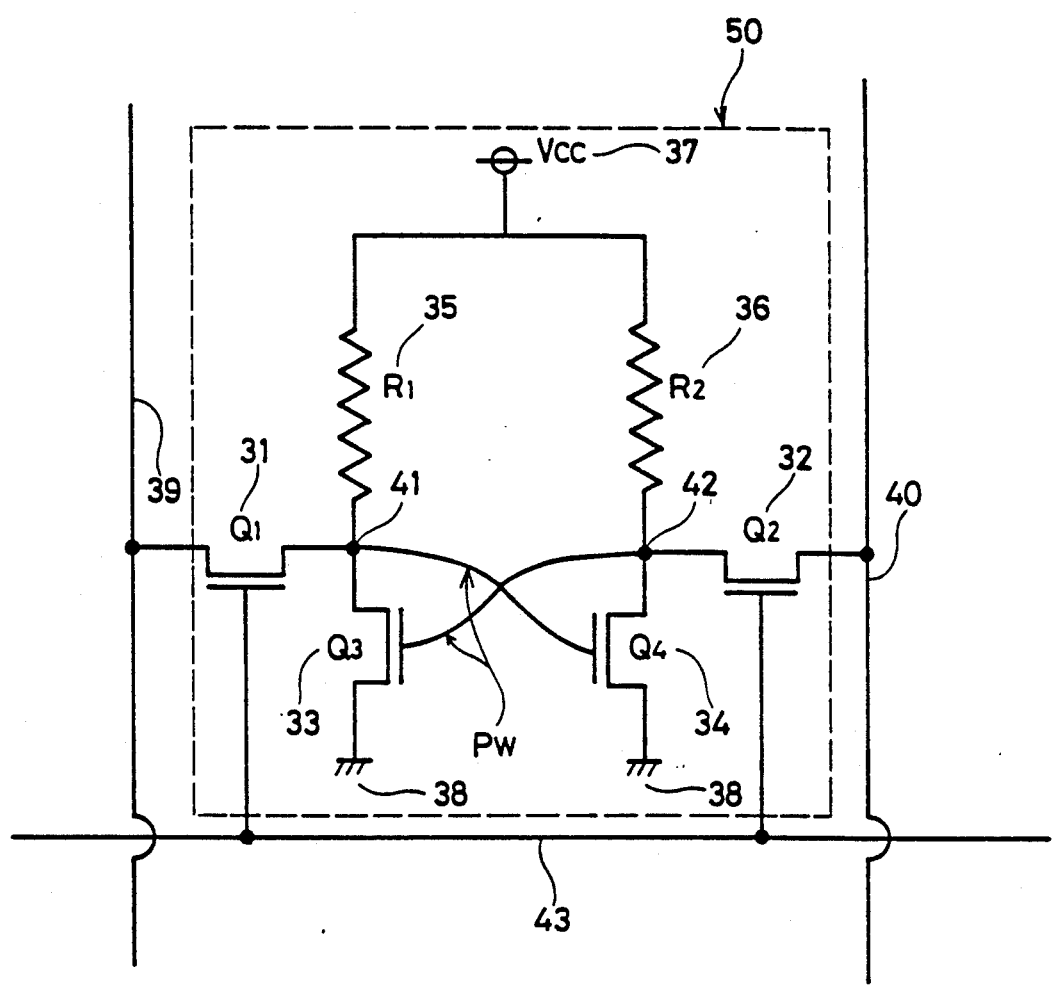
FIG. 5 is an equivalent circuit diagram of the high resistance load type SRAM memory cell according to the present invention.

Referring to FIG. 5, the cross-coupling wiring of the drain region and the gate electrode in the SRAM memory cell according to the present invention is formed by wiring sections PW formed by polycrystal silicon layers. The memory cell 50 shown in FIG. 5 is incorporated into the SRAM shown in FIG. 1A. Data read-out and writing may be performed as conventionally.

Each of the MOSFETs 31, 32, 33 and 34 constituting the memory cell 50 includes a source region and a drain region formed as regions of impurities diffused from the substrate polysilicon layer and the semiconductor substrate. Both ends of the gate region of each MOSFET are defined by this substrate polysilicon layer. The above described structure is referred to hereinafter as the poly-source drain structure. MOSFET's having this general type of structure are commonly referred to in the art as Polysilicon Source Drain or PSD transistors.

Detailed descriptions of the prior art technology of the MOSFET directly pertinent to this polysilicon source drain structure may be found in the IEEE ELECTRON DEVICE LETTERS VOL. EDL-5, No. 10 p. 400–402 (OCTOBER 1984), VOL. EDL-7, No. 5 p. 314–316 (MAY 1986), VOL. EDL-8, No. 4, p. 165-167 (APRIL 1987).

Figure 6:
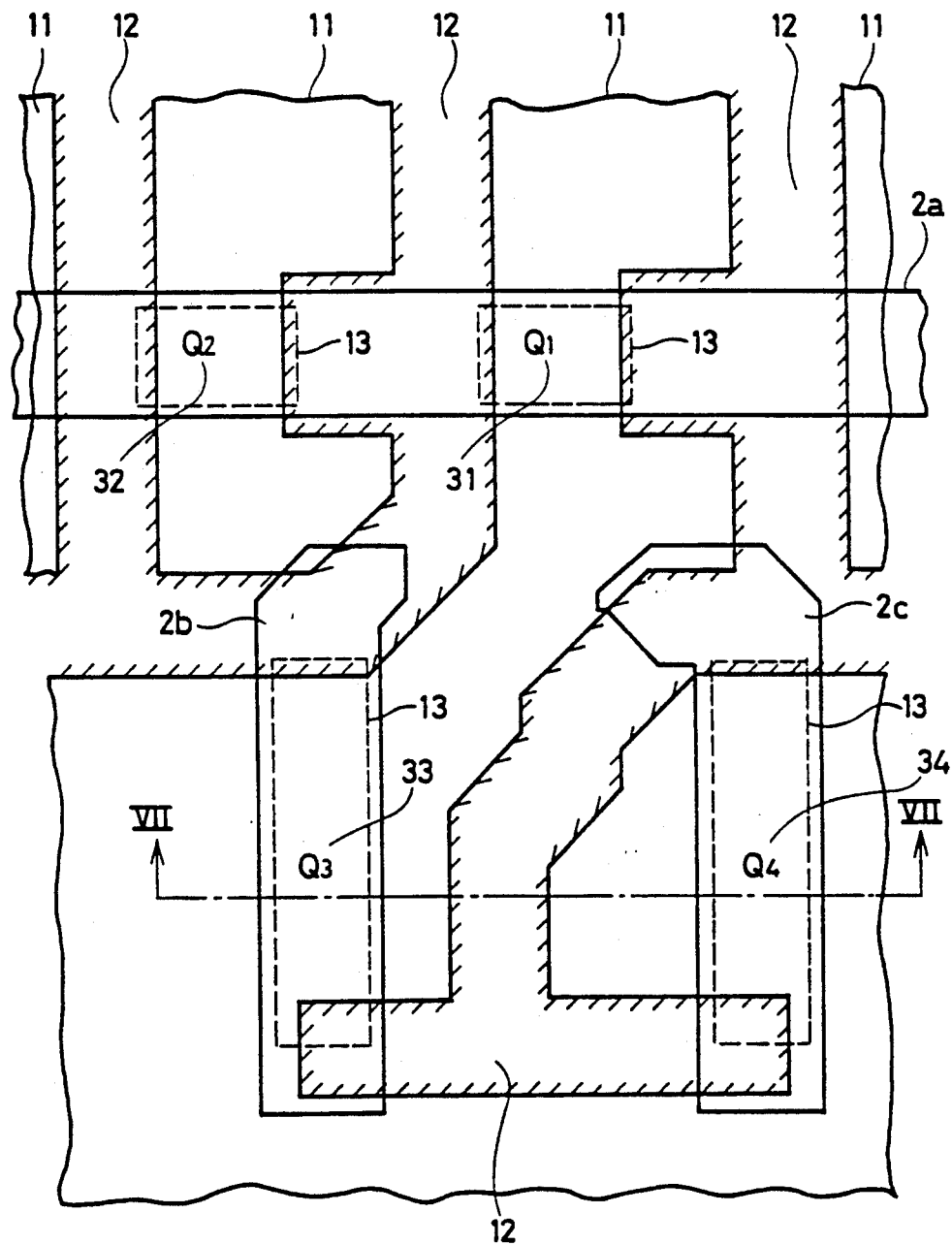
FIG. 6 is a plan view showing the pattern layout of the high resistance load type SRAM memory cell to which the first embodiment of the present invention is applied, with the pattern layout being shown in a simplified form.
Figure 9:
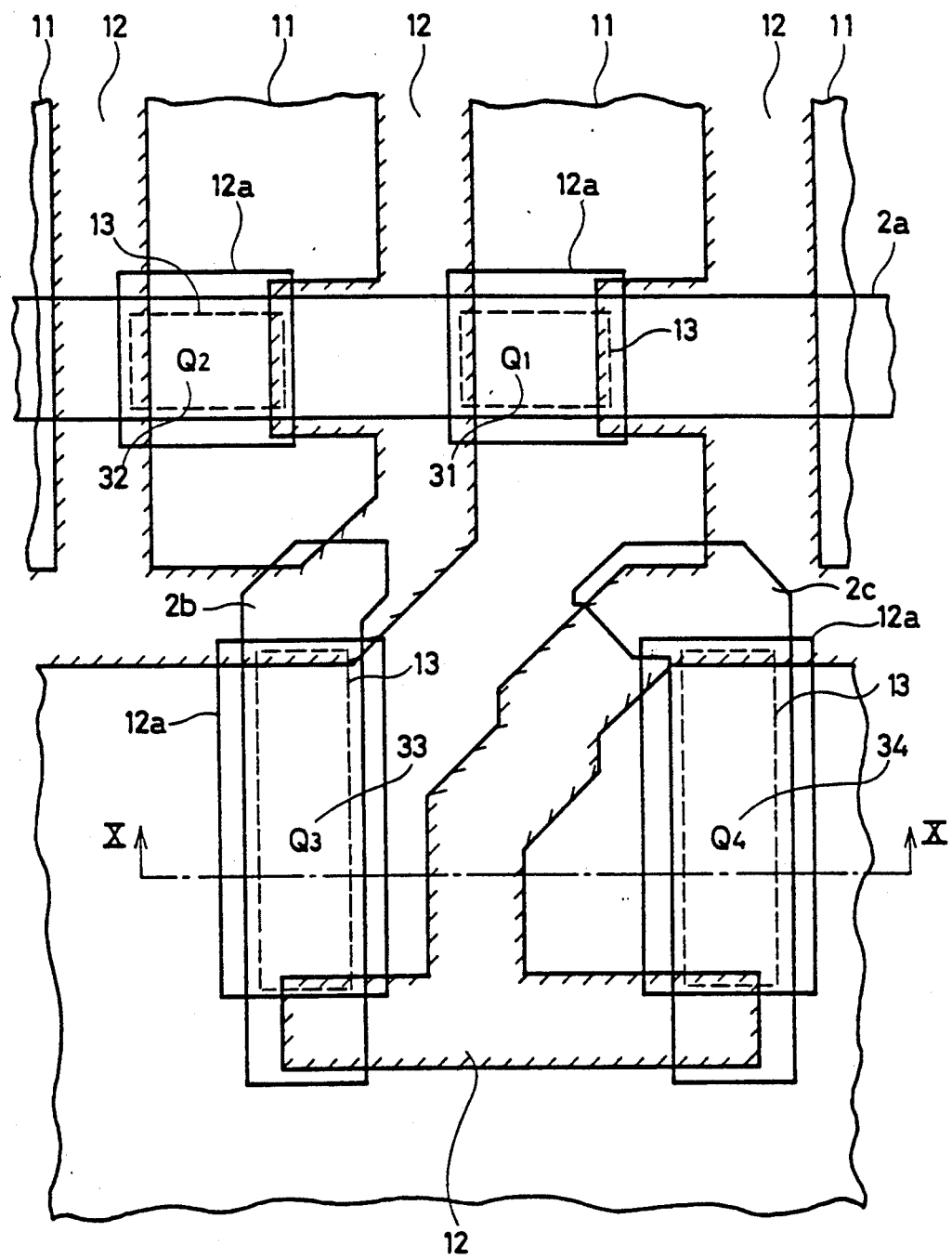
FIG. 9 is a plan view showing the pattern layout of the high resistance load type SRAM memory cell to which the second embodiment of the present invention is applied, with the pattern layout being shown in a simplified form.
Figure 12:
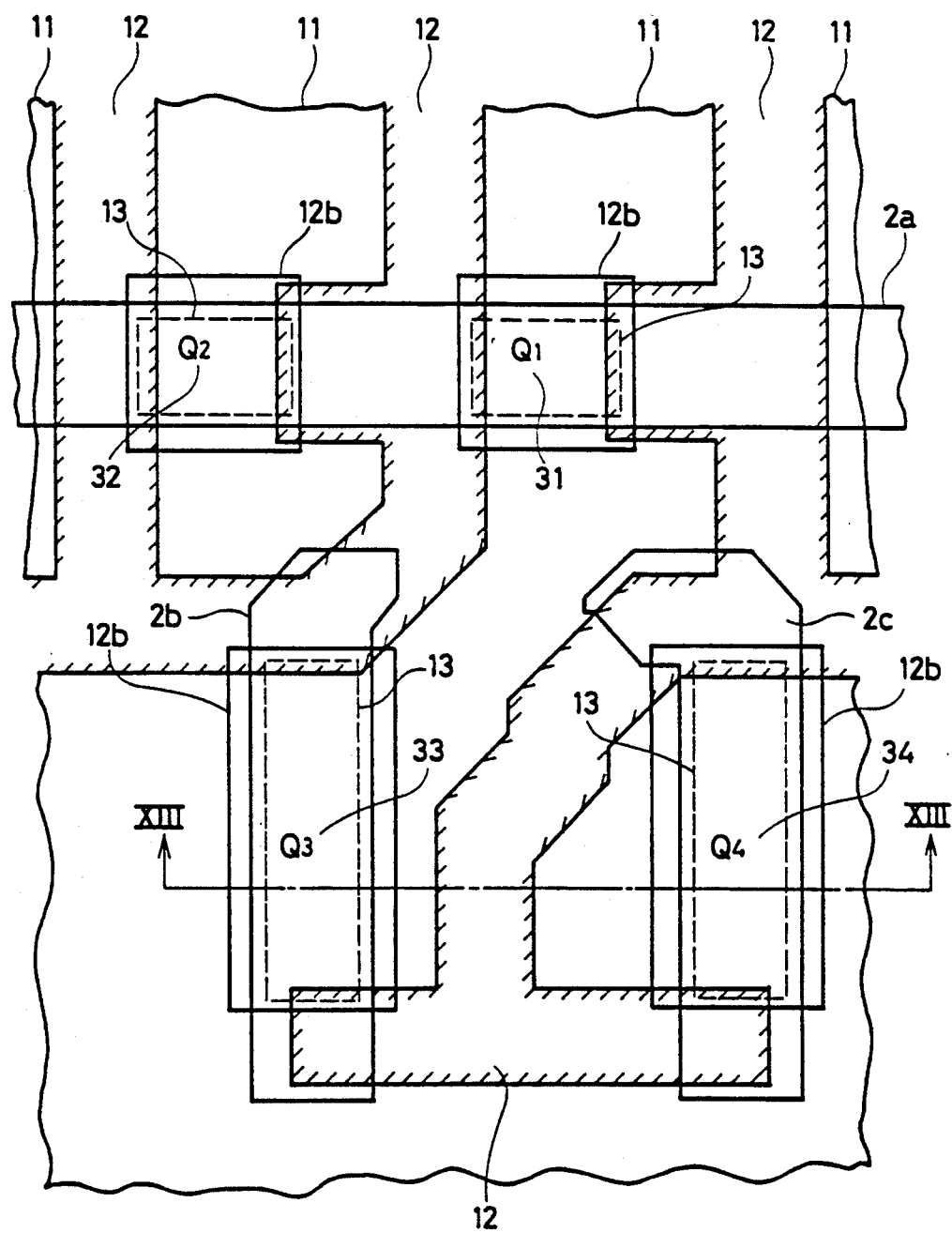
FIG. 12 is a plan view showing the pattern layout of the high resistance load type SRAM memory cell to which the third embodiment of the present invention is applied, with the pattern layout being shown in a simplified form.

The pattern layout of the high resistance load type SRAM memory cell according to the embodiments of the present invention is shown in FIGS. 6, 9 and 12 in a simplified form. This pattern layout corresponds to those of the conventional SRAM memory cell shown in FIG. 3. Therefore, this pattern layout shows the construction up to the formation of the gate electrode. Subsequently to the formation of the gate electrode, the formation of the second polysilicon layer, third polysilicon layer, contact holes for interconnecting these polysilicon layers and the bit lines is performed similarly to the construction shown in FIG. 2.

Figure 7:
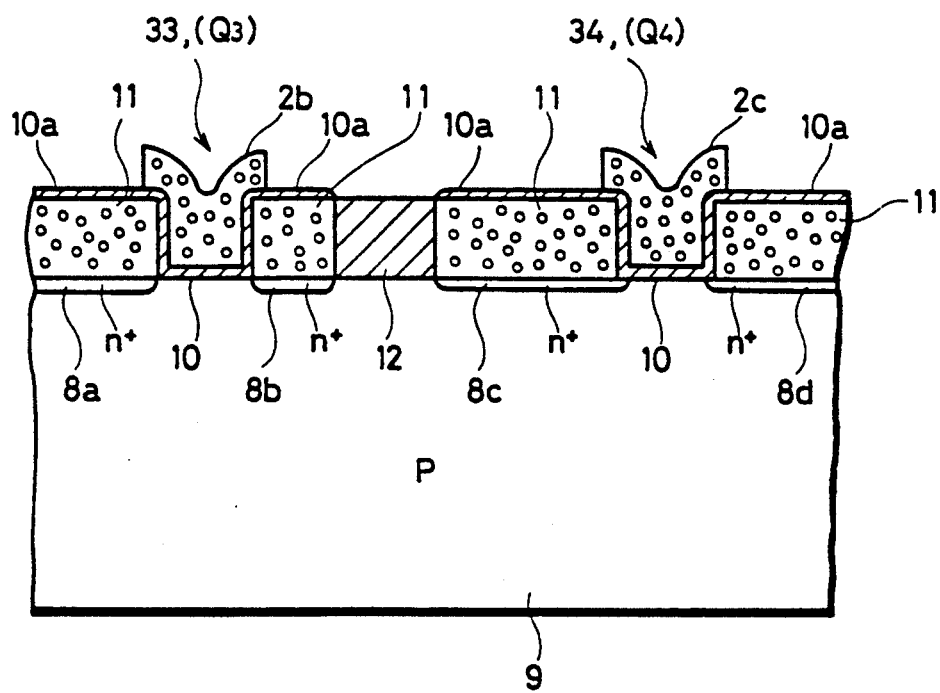
FIG. 7 is a cross sectional view taken along line VII—VII line in FIG. 6, and showing the stage of preparation up to the formation of the gate electrode.

First, the high resistance load type SRAM memory cell according to the first embodiment shown in FIGS. 6 and 7 makes use of the MOSFET of the above described poly-source/drain structure. The poly-source/-drain structure MOSFET according to the first embodiment includes a substrate polysilicon layer 11 containing n+impurities formed on the p-type silicon semiconductor substrate 9. This substrate polysilicon layer 11 delimits both ends of the gate region of each of the MOSFETs 31, 32, 33 and 34 of the poly-source/drain structure. In predetermined regions selectively freed of the substrate polysilicon layer 11 are formed an isolation region 12 and a portion reserved for the gate region 13. The isolation region 12 is formed by charging an insulator such as a silicon oxide film into a space between the substrate polysilicon layers 11. A gate oxide film 10 is formed by heat-treating the surface of the silicon semiconductor substrate 9 exposed at the portion reserved for the gate region 13. By this heat treatment, impurities from the substrate polysilicon layer 11 are diffused for forming the source and drain regions 8a, 8b, 8c and 8d of the MOSFETs 33, 34 formed by n+diffusion regions, as shown in FIG. 7. Although not shown, the source and drain regions of the MOSFETs 31, 32 may be formed in the similar manner.

In the first embodiment employing the MOSFET of the above described poly-source/drain structure, the production process up to the formation of the gate electrode will be explained.

Figure 8A:
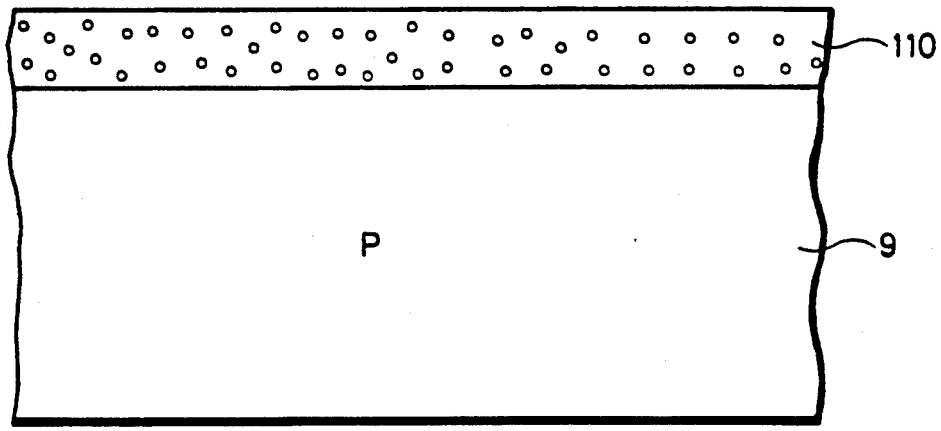
Figure 8B:
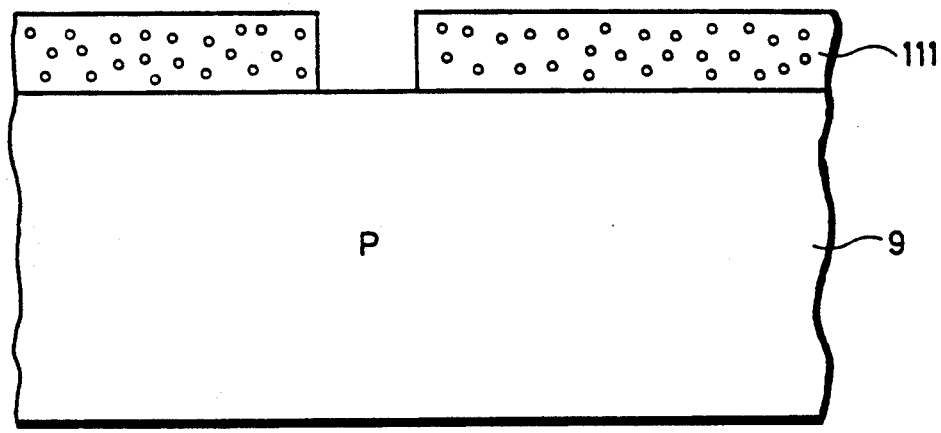
Figure 8C:
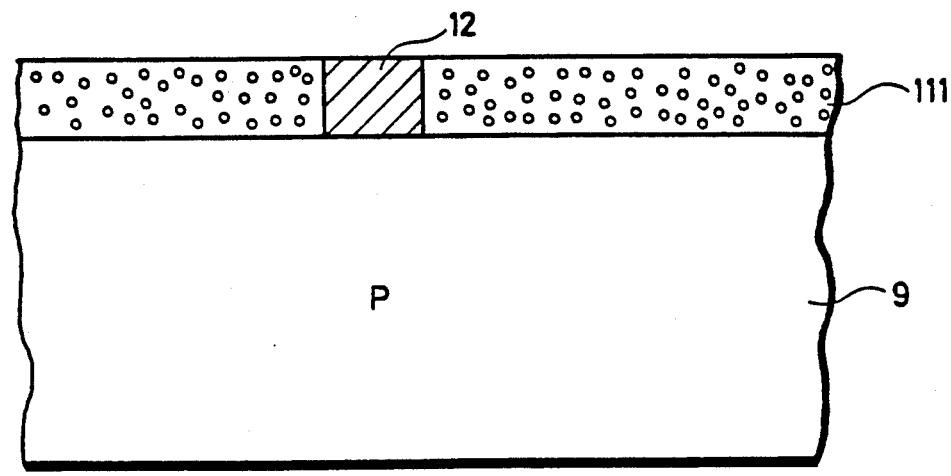

Referring to FIG. 8A, a polysilicon layer 110 containing n+impurities is formed on a P-type silicon semiconductor substrate 9. Referring to FIG. 8B, the portion of the polysilicon layer 110 corresponding to the isolation region is selectively removed by a pholithographic and etching method for forming a patterned polysilicon layer 111. As shown in FIG. 8C, an insulator such as a silicon oxide film is selectively buried in the portion freed of the polysilicon layer, thereby forming the isolation region 12.

Referring to FIG. 8D, the portion corresponding to the gate region of the polysilicon layer 111 is selectively removed by etching. In this manner, only those regions of the silicon semiconductor substrate 9 corresponding to the predetermined gate width and channel length are exposed. Referring to FIG. 8E, thin oxide films are formed by heat treatment on the exposed portions of the main surfaces inclusive end surfaces, of the silicon semiconductor substrate 9 and the surface of the pattern substrate polysilicon layers 11. In this manner, thin gate oxide films 10 having controlled channel widths are formed on the main surface of the silicon semiconductor substrate 9. Oxide films 10a are formed on the surfaces, inclusive of end surfaces, of the substrate polysilicon layer 11. Simultaneously, n+impurities are diffused from the substrate polysilicon layers 11 into the silicon semiconductor substrate 9 for forming an n+source region and drain regions 8a, 8b, 8c and 8d. Subsequently, as shown in FIG. 8F, a word line 2a and gate electrodes 2b, 2c are formed from polysilicon or the like material.

Therefore, in the SRAM memory cells having the construction shown in the first embodiment. Of the present invention, in as much as the poly-source/drain structure MOSFET is applied to the high resistance load type SRAM memory cell, the resistance value so far defined by the shift resistance of the n+diffusion region may now be defined as a resistance value of the substrate polysilicon layer 11. Also, by using techniques such as reacting the surface of the substrate polysilicon layer 11 with metals such as molybdenum or tungsten to form silicides, the resistance values of the regions reserved for the source and drain regions may be lowered easily. As a result, the parasitic resistance may be lowered in the cross-coupling wiring region interconnecting these diffusion regions. Consequently, the wiring in the memory cell may be made unexceptionally through the polysilicon layers, the memory cell may be freed of asymmetricities, while the access time may be prevented from being increased. Moreover, in this poly-source/drain structure, the junction depths of the n+diffusion region may be extremely shallow so that the short channel effect may be reduced and hence the sub-threshold current may also be lowered. As a result, the high resistance load type SRAM memory cell may be improved in stability and data storage property, and an SRAM may be produced which is suited to high integration and low power consumption.

Figure 10:
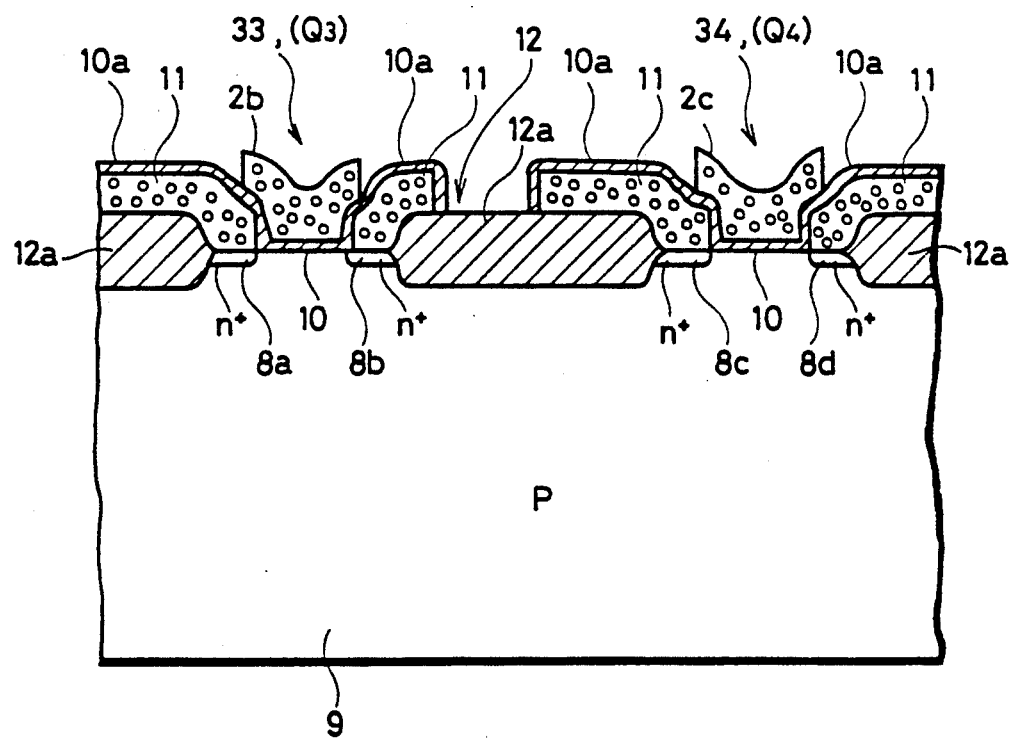
FIG. 10 is a partial cross sectional view taken along line X—X line in FIG. 9, and showing the stage of preparation up to the formation of the gate electrode.

Referring now to FIGS. 9 and 10, the second embodiment of the present invention will be explained. In this second embodiment, a substrate polysilicon layer 11 is formed for extending over the isolation region 12a formed by a thick oxide film. The source and drain regions of each of the MOSFETs 31, 32, 33 and 34 are defined by this isolation region 12a. Adjacent substrate polysilicon layers 11 are insulated from each other by an isolation region 12. The substrate polysilicon layers 11 are formed on those regions of the silicon semiconductor substrate 9 in which the desired source and drain regions are to be formed. Meanwhile, in FIG. 9, an isolation region formed of a thick oxide film is formed to the outside of a rectangle defined by a line shown at 12a.

The production process up to the formation of the gate electrode in the present second embodiment is now explained. First, referring to FIG. 11A, the isolation regions 12a are formed on the P-type silicon semiconductor substrate 9 such as, for example, by thermal oxidation, at a predetermined spacing from an another. Then, as shown in FIG. 11B, a polysilicon layer 110 containing n+impurities is formed on the overall surface. Referring to FIG. 11, the polysilicon layer 110 is selectively removed by a photolithographic and etching method at those portion corresponding to the isolation region 12 and portions reserved for the gate region 13 to form a patterned substrate polysilicon layer 11. In this manner, under the limitation of both ends of the source and drain regions, only those portions of the main channel surface of the silicon semiconductor substrate 9 corresponding to the predetermined gate width and channel length are exposed.

Figure 11D:
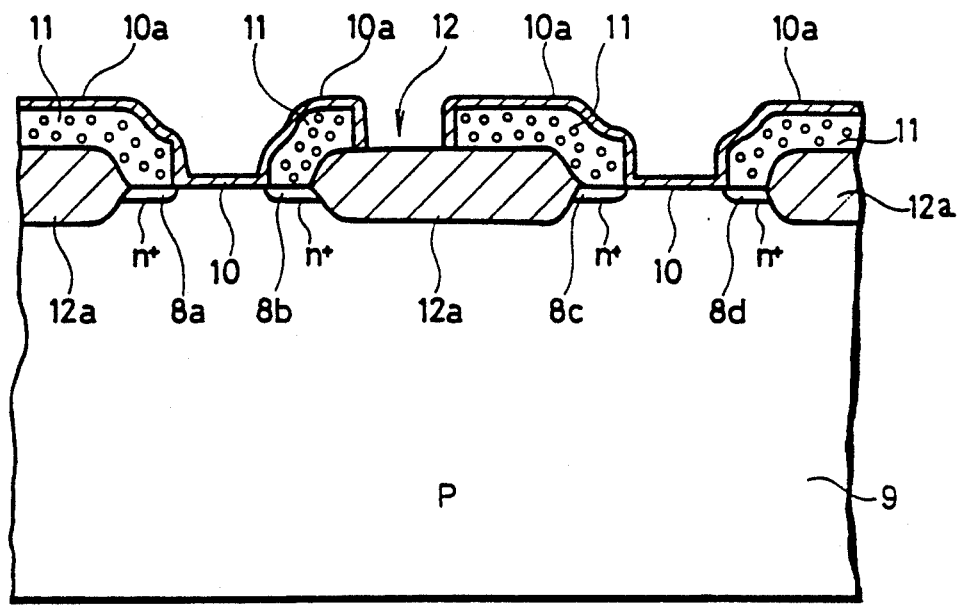
Figure 11E:
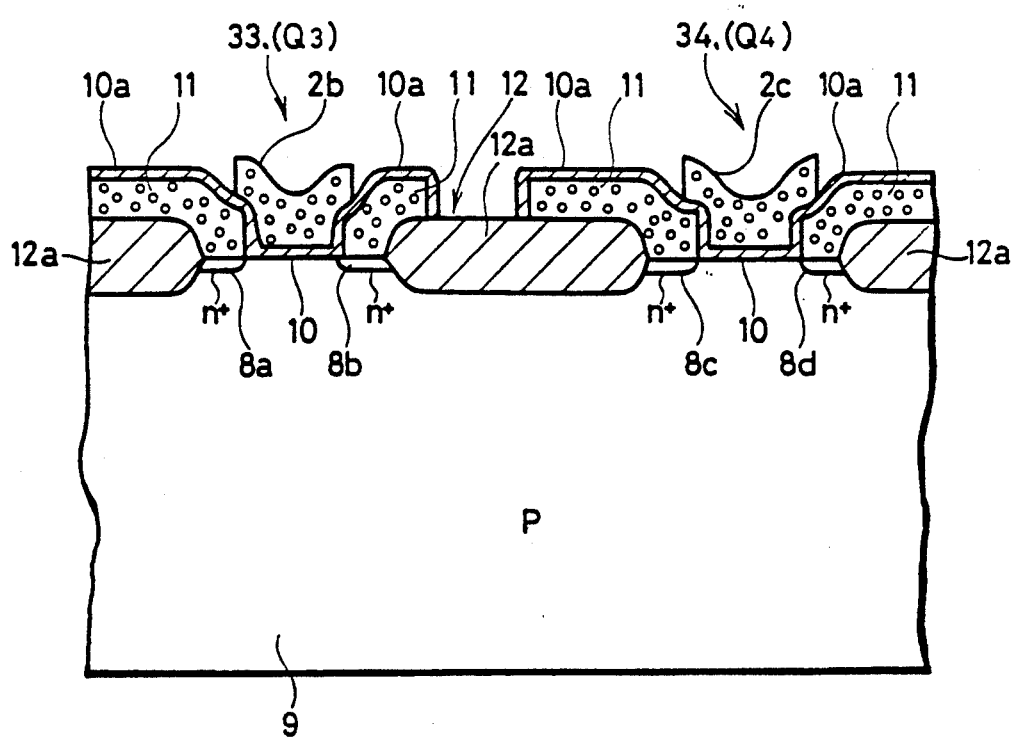

Referring to FIG. 11D, a thin oxide film is formed by heat treatment on the exposed portion of the main surface of the silicon semiconductor substrate 9 and on the surfaces, inclusive of end surface portions, of the patterned substrate polysilicon layer 11. In this manner, the thin gate oxide film 10 having a controlled channel length is formed on the main surface of the silicon semiconductor substrate 9. On the other hand, an oxide film 10a is formed on the surfaces, inclusive of the end surfaces, of the substrate polysilicon layer 11. Simultaneously, n+impurities are diffused from the substrate polysilicon layer 11 into the silicon semiconductor substrate 9 to form an n+source region and drain regions 8a, 8b, 8c, 8d. Then, as shown in FIG. 11A, the word line 2a and the gate electrodes 2b, 2c are formed from polysilicon or the like material.

Thus, in this second embodiment, as in the above described first embodiment, the resistance values of the regions conventionally determined by the sheet resistance of the n+diffusion region, may now be determined by the resistance of the substrate polysilicon layer 11. Hence, the parasitic resistances of the source and drain regions may be reduced. Thus the wiring interconnecting the diffusion regions in the memory cell is unexceptionally made through the polysilicon layer, so that the memory cell may be freed of asymmetricities, while the access time may be prevented from being increased. On the other hand, the junction depth of the n+diffusion region may be reduced so that the short channel effect the sub-threshold current may be lowered.

Above all, in the present second embodiment, the isolation region 12a formed of a thin oxide film is formed for delimiting the ends of the source and drain regions. Hence, as shown for example in FIG. 10, the area and the edge length or peripheral length of the drain regions 8b, 8c of the MOSFETs 33, 34 may be reduced. As a result, the junction leakage may be reduced, so that the stability and data storage properties of the high resistance load type SRAM memory cell may be effectively improved.

Figure 13:
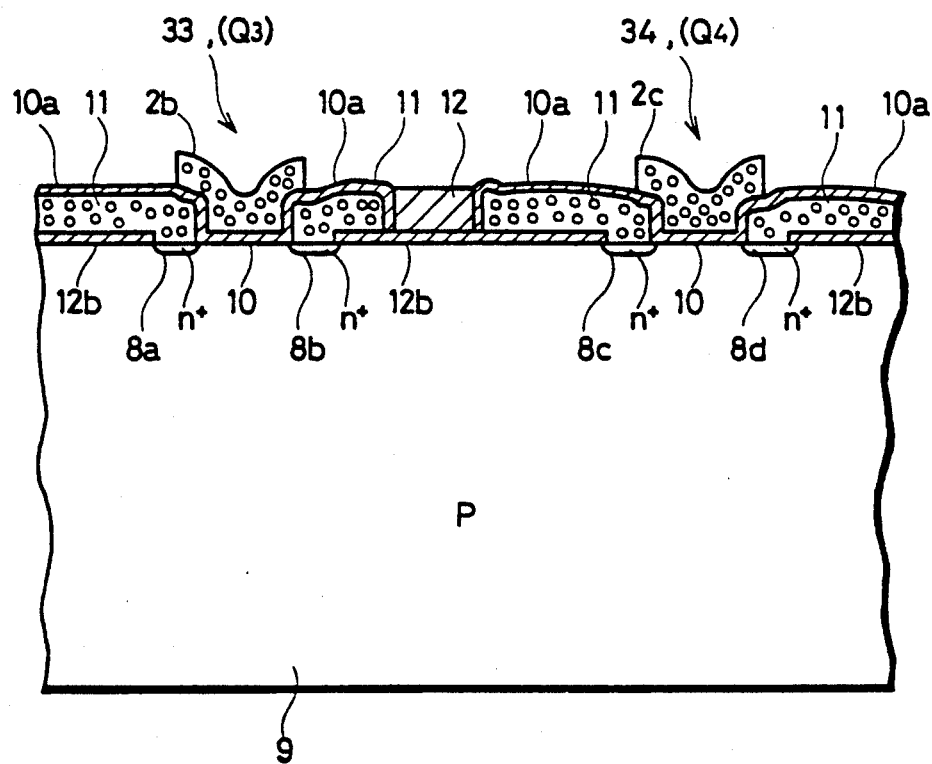
FIG. 13 is a cross sectional view taken along line XIII—XIII in FIG. 12, and showing the stage of preparation up to the formation of the gate electrode.

In the third embodiment shown in FIGS. 12 and 13, the arrangement of the above described first embodiment shown in FIG. 7 is modified in that a thin oxide film 12b having a film thickness similar to that of the gate oxide film 10 is formed on the surface of the silicon semiconductor substrate 9 in an area which is defined between the drain regions 8b and 8c and which is in contact with the isolation region 12. This thin oxide film 12b corresponds to the isolation region 12 in FIG. 10. The source and drain regions are delimited by both ends of this thin oxide film 12b. On this thin oxide film 12b, there is formed the isolation region 12 which is formed of an insulator and which is filled into a space between the adjacent substrate polysilicon layers 11. The operation and the effect of the above described third embodiment is similar to that of the above described first and second embodiments.

Above all, in the third embodiment, a capacitance is formed between the substrate polysilicon layer 11 and the silicon semiconductor substrate 9 opposing to each other through the medium of this thin oxide film 12b. Therefore, the node capacitance in the memory cell may be increased. As a result, stored charges in the memory cell node may be increased, so that the resistance to soft errors caused by noise charges due to, for example, so-called extraneous α-rays, may be improved.

Figure 14A:
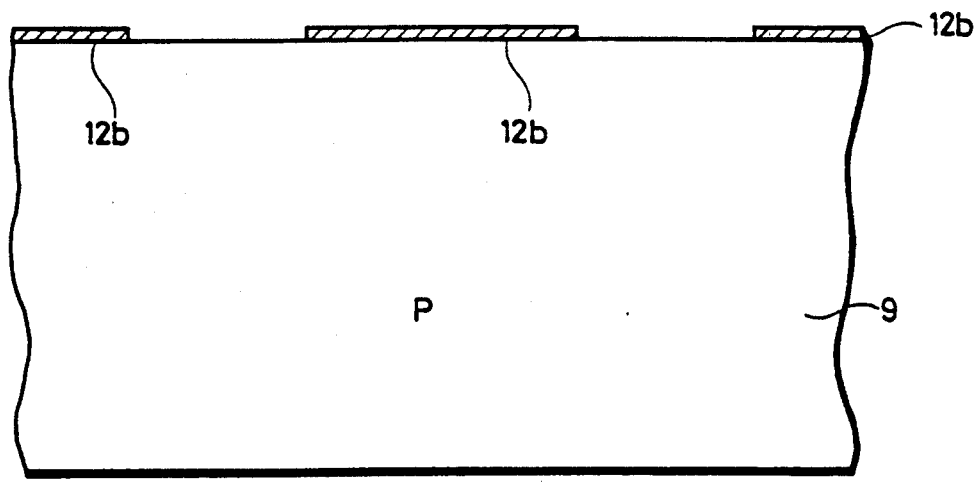
FIGS. 14A, 14B 14C, 14D and 14E are partial cross sectional views showing the construction shown in FIG. 13 in the sequence of the production steps.
Figure 14B:
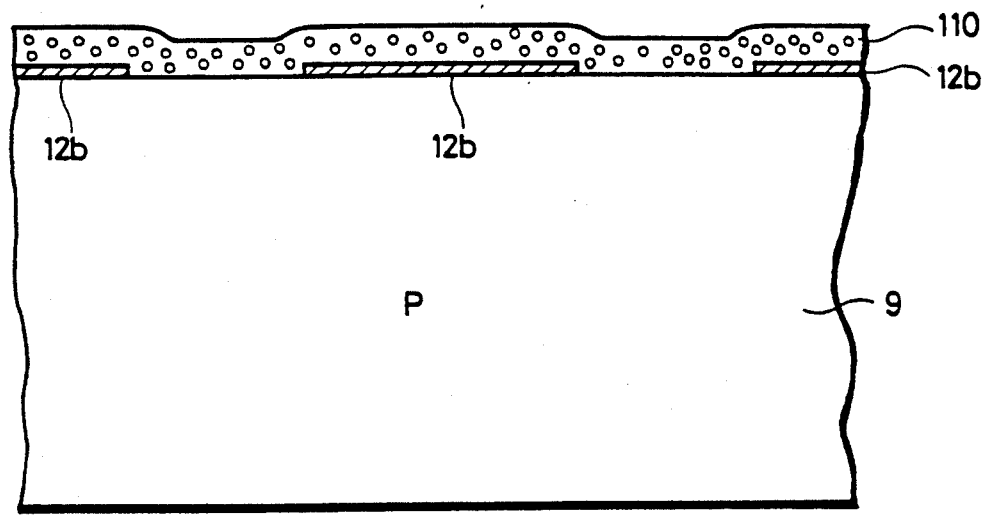
Figure 14C:
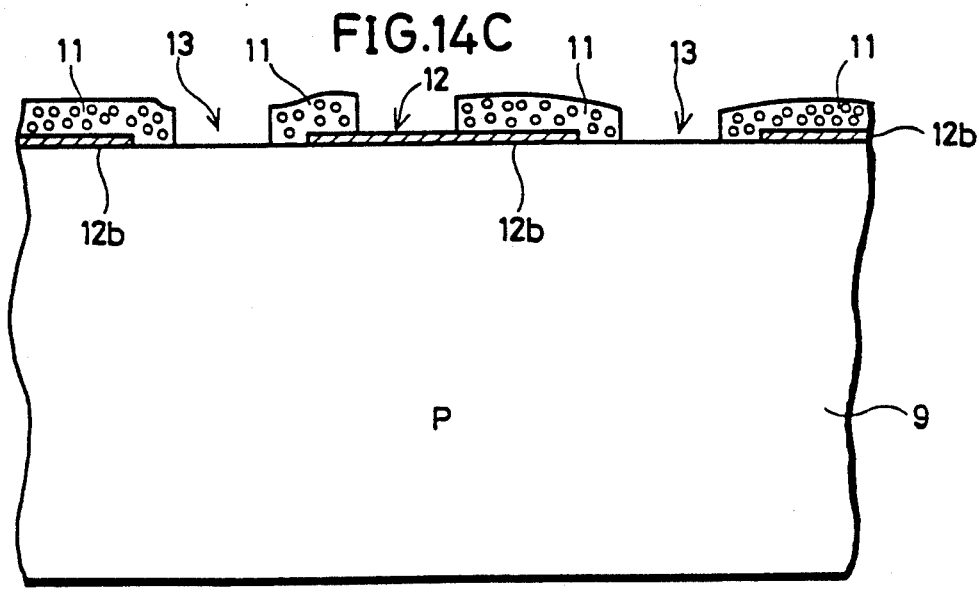

The production process up to the formation of the gate electrode of the third embodiment will be explained. First, referring to FIG. 14A, the isolation regions 12b are formed with a predetermined spacing from one another on the P-type silicon semiconductor substrate 9 as thin oxide films by thermal oxidation. Then, as shown in FIG. 14B, the polysilicon layer 110 containing n+impurities is formed on the overall surface. As shown in FIG. 14C, the polysilicon layer 110 is selectively removed by a photolithographic and etching method at the portions corresponding to the isolation region 12 and the portion corresponding to the gate region 13 to from a patterned substrate polysilicon layer 11. In this manner, under delimitation of both ends of the source and drain regions on the silicon semiconductor substrate 9, only those areas corresponding to the predetermined gate width and channel length may be exposed.

Figure 14D:
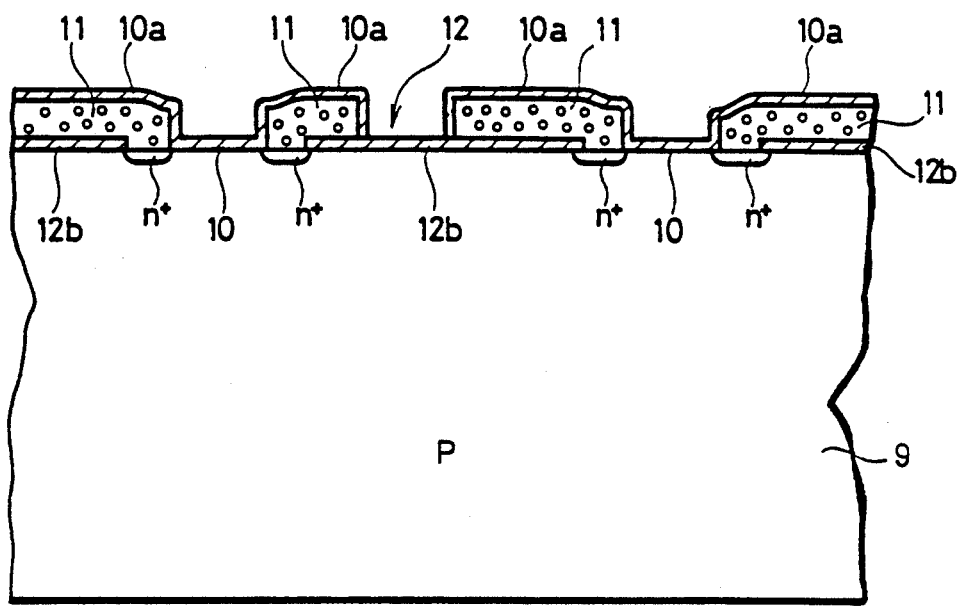
Figure 14F:
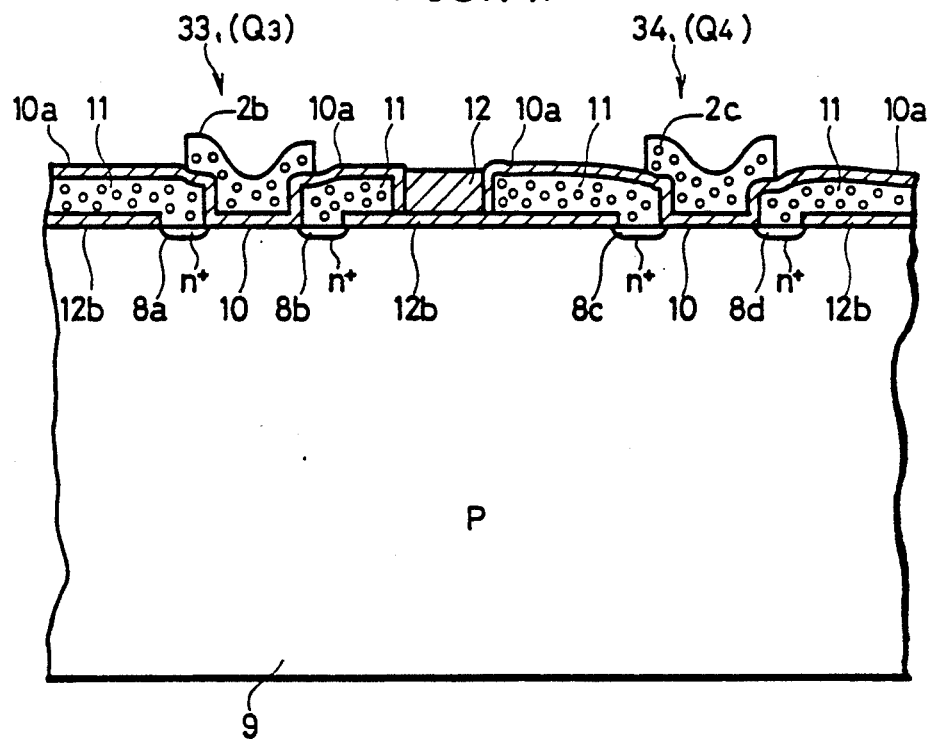

Referring to FIG. 14D, a thin oxide film is formed by heat treatment on the main surface of the silicon semiconductor substrate 9 and on the surfaces, inclusive of end surfaces, of the patterned substrate polysilicon layer 11, as in the above described second embodiment. In this manner, a thin gate oxide film 10 having a controlled channel length is formed on the main surface of the silicon semiconductor substrate 9. On the other hand, an oxide film 10a is formed on the surfaces, inclusive of end surfaces, the substrate polysilicon layer 11. Simultaneously, N+impurities are diffused from the substrate polysilicon layer 11 into the silicon semiconductor substrate 9 to form an n+source region and drain regions 8a, 8b, 8c, 8d. As shown in FIG. 14E, the word line 2a and the gate electrode 2b, 2c are formed from, for example, polysilicon.

According to the present invention, as described hereinabove, the source and drain regions are formed from polycrystal silicon layers formed on the semiconductor substrate and delimiting the both ends of the gate region, so that the parasitic resistance in the wiring region may be reduced, while the leakage current due to short channel effect may also be reduced. On the other hand, the cross-coupling wiring in the memory cell is made unexceptionally by the medium of the polycrystal silicon layer, so that the memory cell may be freed of asymmetries, and hence the static type semiconductor memory device may be provided which is improved in both stability and data storage property. The static type semiconductor memory device according to the present invention has the construction suited to high integration and low power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device including a memory cell having a pair of field effect transistors each having a gate electrode cross-coupled to a drain region connected to a power source terminal by way of a load resistor, comprising:
   a semiconductor substrate of a first conductivity type having a main surface; at least one of said transistors comprising
   (i) polycrystal silicon layers formed on said main surface of said semiconductor substrate with a spacing from one another for defining a channel region on said main surface, said polycrystal silicon layers containing impurities of a second conductivity type,
   (ii) source and drain regions of the second conductivity type below said polycrystal silicon layers, said source and drain regions being formed by introducing said impurities from said polycrystal silicon layers into said semiconductor substrate such that edges of the source and drain regions are aligned with edges of the corresponding polycrystal silicon layer, and
   (iii) a gate electrode formed on said channel region and on said polycrystal silicon layers with a gate insulting film interposed; and
   an isolation portion formed on exposed portions of the main surface of the semiconductor substrate between adjacent polycrystal silicon layers which connect to source and drain regions, wherein said isolation portion is of substantially the same thickness as said polycrystal silicon layers.

2. A static type semiconductor memory device according to claim 1, wherein
   said polycrystal silicon layers are formed on an insulating layer on the main surface of said semiconductor substrate for delimiting said source and drain regions.

3. A static type semiconductor memory device including a memory cell having a pair of field effect transistors each having a gate electrode cross-coupled to a drain region connected to a power source terminal by way of a load resistor, comprising:
   a semiconductor substrate of a first conductivity type having a main surface;
   polycrystal silicon layers formed on said main surface of said semiconductor substrate with a spacing from one another for defining a channel region on said main surface, said polycrystal silicon layers containing impurities of a second conductivity type;

first and second field effect transistors having said channel region and formed on said semiconductor substrate, each of said first and second field effect transistors including:

(i) source and drain regions of the second conductivity type below said polycrystal silicon layers, said source and drain region being formed by introducing said impurities from said polycrystal silicon layers into said semiconductor substrate such that edges of the source and drain regions are aligned with edges of the corresponding polycrystal silicon layer, and (ii) a gate electrode on said channel region and said polycrystal silicon layers with a gate insulating film interposed; and an isolation portion formed on exposed portions of the main surface of the semiconductor substrate between adjacent polycrystal silicon layers which connect to source and drain regions, wherein said isolation portion is of substantially the same thickness as said polycrystal silicon layers, one of said source and drain regions of said first field effect transistor and said gate electrode of said second field effect transistor being cross-coupled to each other through the medium of said polycrystal silicon layers, one of said source and drain regions of said second field effect transistor and said gate electrode of said first field effect transistor and being similarly cross-coupled to each other through the medium of said polycrystal silicon layers.

4. A static type semiconductor memory device, comprising a semiconductor substrate of a first conductivity type having a main surface;

polycrystal silicon layers formed on said main surface of said semiconductor substrate with a spacing from one another for defining a channel region on said main surface, said polycrystal silicon layers containing impurities of a second conductivity type;

a plurality of memory cells formed on the main surface of said semiconductor substrate, each said memory cell comprising (i) a first driver transistor constituted by a first field effect transistor connected between a first memory cell node and a first potential node, said first field effect transistor including a gate electrode connected to a second memory cell node and formed on said channel region and on said polycrystal silicon layers with a gate insulating film interposed, and source and drain regions of a second conductivity type formed below said polycrystal silicon layers by introducing said impurities from said polycrystal silicon layers into said semiconductor substrate such that edges of the source and drain region of said first field effect transistor are aligned with edges of the corresponding polycrystal silicon layer, (ii) a second driver transistor constituted by a second field effect transistor connected between said second memory cell node and first potential node, said second field effect transistor including a gate electrode connected to said first memory cell node and formed on said channel region and on said polycrystal silicon layers with a gate insulating film interposed, and source and drain regions of a second conductivity type formed below said polycrystal silicon layers by introducing said impurities from said polycrystal silicon layers into said semiconductor substrate such that edges of the source and drain regions of said second field effect transistor are aligned with edges of the corresponding polycrystal silicon layer, (iii) a first load element connected between said first memory cell node and a second potential node, and (iv) a second load element connected between said second memory cell node and said second potential node; and an isolation portion formed on exposed portions of the main surface of the semiconductor substrate between adjacent polycrystal silicon layers which connect to source and drain regions, wherein said isolation portion is of substantially the same thickness as said polycrystal silicon layers.

5. A static type semiconductor memory device according to claim 4, wherein said memory cells are formed at points of intersection between word lines and bit line paris on the main surface of said semiconductor substrate, each of said memory cells further including a first access transistor constituted by a third field effect transistor connected between said first memory cell node and a line of one of said bit line paris, said third field effect transistor including a gate electrode connected to one of the word lines and formed on said channel region and said polycrystal silicon layers with a gate insulating film interposed, and source and drain regions of a second conductivity type formed below said polycrystal silicon layers by introducing said impurities from said polycrystal silicon layers into said semiconductor substrate, a second access transistor constituted by a fourth field effect transistor connected between said second memory cell node and the other line of said one bit line pair, said fourth field effect transistor including a gate electrode connected to said one word line and formed on said channel region and said polycrystal silicon layers with a gate insulating film interposed, and source and drain regions of a second conductivity type formed below said polycrystal silicon layers by introducing said impurities from said polycrystal silicon layers into said semiconductor substrate.

6. A static type semiconductor memory device according to claim 4, wherein one of said source and drain regions and said memory cell node are connected to each other through the medium of said polycrystal silicon layer, while the other of said source and drain regions and said first potential node are connected to each other through the medium of said polycrystal silicon layers.

7. A static type semiconductor memory device according to claim 6, wherein said first and second driver transistors are isolated from each other by an insulating layer filled in exposed portions of the main surface of said semiconductor substrate between adjacent polycrystal silicon layers.

8. A static type semiconductor memory device according to claim 7, wherein
said insulating layer is of substantially the same thickness as the thickness of said polycrystal silicon layers.

9. A static type semiconductor memory device according to claim 6, wherein
said polycrystal silicon layers are formed on an insulating layer on said main surface of said semiconductor substrate for delimiting the edges of said source and drain regions.

10. A static type semiconductor memory device according to claim 9, wherein
said insulating layer is of substantially the same thickness as the thickness of said gate insulating film.

11. A memory cell of a static type semiconductor memory device comprising:
a first driver transistor constituted by a first MOS transistor, connected between a first memory cell node and a first potential node, and said first MOS transistor including a gate electrode connected to a second memory cell node;
a second driver transistor constituted by a second MOS transistor, connected between said second memory cell node and said first potential node, and said second MOS transistor including a gate electrode connected to said first memory cell node;
a first load element connected between said first memory cell node and a second potential node; and
a second load element connected between second memory cell node and said second potential node;
wherein the MOS transistors each comprise
(i) polycrystal silicon layers formed on a main surface of a semiconductor substrate with a spacing from one another for defining a channel region on said main surface, said polycrystal silicon layers containing impurities,
(ii) source and drain regions below said polycrystal silicon layers, said source and drain region comprising impurities diffused from said polycrystal silicon layers into said substrate such that edges of the source and drain regions are aligned with edges of the corresponding polycrystal silicon layer, the electric resistance between one of said source-drain regions and said memory cell node, and the electric resistance between the other of said source-drain regions and said first potential node being lowered by said polycrystal silicon layers, and
(iii) a gate electrode formed on said channel region with a gate insulating film interposed therebetween; and
an insulator filled in exposed portions of the main surface of said substrate between adjacent polycrystal silicon layers for isolating said transistors, wherein said insulator for isolation is of substantially the same thickness as the thickness of said polysilicon layers.

* * * * *